United States Patent
Liu et al.

(10) Patent No.: US 8,502,946 B2
(45) Date of Patent: Aug. 6, 2013

(54) ARRAY SUBSTRATE OF FRINGE FIELD SWITCHING MODE LIQUID CRYSTAL DISPLAY PANEL AND METHOD OF MANUFACTURING THE SAME

(75) Inventors: Chih-Chung Liu, Guangdong (CN); Kuan-Hsien Jiang, Guangdong (CN); Bei Xie, Guangdong (CN); XiYao Li, Guangdong (CN)

(73) Assignee: Century Technologh ShenzhenCorporation Limited, Shenzhen (CN)

( * ) Notice: Subject to any disclaimer, the term of this patent is extended or adjusted under 35 U.S.C. 154(b) by 146 days.

(21) Appl. No.: 13/304,320

(22) Filed: Nov. 24, 2011

(65) Prior Publication Data
US 2013/0083280 A1 Apr. 4, 2013

(30) Foreign Application Priority Data
Sep. 30, 2011 (CN) .......................... 2011 1 0298151

(51) Int. Cl.
*G02F 1/1343* (2006.01)
*G02F 1/1333* (2006.01)

(52) U.S. Cl.
USPC .............................. 349/141; 349/146; 349/58

(58) Field of Classification Search
USPC ............................................ 349/141, 146, 58
See application file for complete search history.

(56) References Cited

U.S. PATENT DOCUMENTS

| | | | | |
|---|---|---|---|---|
| 6,784,965 B2 * | 8/2004 | Kim et al. | ...................... | 349/141 |
| 6,791,651 B2 * | 9/2004 | Jo et al. | ......................... | 349/141 |
| 6,806,935 B2 * | 10/2004 | Song | .............................. | 349/141 |
| 7,528,918 B2 * | 5/2009 | Yoo et al. | ...................... | 349/141 |

* cited by examiner

*Primary Examiner* — Mike Qi
(74) *Attorney, Agent, or Firm* — Altis Law Group, Inc.

(57) ABSTRACT

An array substrate of a fringe field switching (FFS) mode liquid crystal display (LCD) panel and manufacturing method thereof are provided. The gate electrodes and the common electrode of the FFS mode LCD panel are formed on the array substrate by the same photolithographic process, and the common electrode, the gate lines and the gate electrodes are disposed on the same layer. The passivation layer of the FFS mode LCD panel is formed on the pixel electrodes. The passivation layer has a plurality of first openings, and each of the first openings at least partially exposes the pixel electrodes.

22 Claims, 30 Drawing Sheets

ARRAY SUBSTRATE OF FRINGE FIELD SWITCHING MODE LIQUID CRYSTAL DISPLAY PANEL AND METHOD OF MANUFACTURING THE SAME

BACKGROUND OF THE INVENTION

1. Field of the Invention

The present invention relates to an array substrate of a fringe field switching (FFS) mode liquid crystal display (LCD) panel and method of manufacturing the same, and more particularly, to an array substrate of an FFS mode LCD panel and method of manufacturing the same in which the gate electrodes, the gate lines and the common electrode are disposed on the same layer and patterned by the same photolithographic process.

2. Description of the Prior Art

Liquid crystal display panels, based on different directions of applied electric field that drives the liquid crystal, may be broadly classified into vertical electric field type LCD panels and horizontal electric field type LCD panels.

In a horizontal electric field type LCD panel, the liquid crystal molecules sealed within are driven by a horizontal electric field formed between a common electrode and a pixel electrode. Due to the common electrode and the pixel electrode being arranged in parallel on the same plane of the lower substrate, the liquid crystal is able to be driven by the horizontal electric field generated between the common electrode and the pixel electrode. Therefore, the horizontal electric field type LCD panel is also known as an in-plane switching (hereinafter, referred to as "IPS") mode LCD.

A fringe field switching (FFS) mode LCD panel is actually a kind of modified IPS mode LCD panel. Specifically, the major differences between the conventional FFS mode LCD panel and the conventional IPS mode LCD panel include that common electrodes and pixel electrodes of the FFS mode LCD panel are both made of a transparent conducting material such as indium tin oxide (ITO), and the common electrodes and the pixel electrodes of the FFS mode LCD panel are formed on different levels of an array substrate of the FFS mode LCD panel. Additionally, in the FFS mode LCD panel, the pixel electrodes are either disposed over the common electrode on the lower substrate or arranged below the common electrode on the lower substrate. Either one of the common electrode or the pixel electrode includes a plurality of slits and stripe electrodes so that a fringe electric field is generated thereto. In addition, either the common electrode or the pixel electrode would have a sufficient width so that liquid crystal molecules above the pixel electrode and the common electrode can be all driven. Since the pixel electrode and the common electrode are both made of transparent conducting material which is light permeable, the FFS mode LCD panel obtains an improved aperture ratio and transmittance over the conventional IPS mode LCD panel.

There has been a proposed method of manufacturing an FFS mode LCD panel, which requires six photolithographic processes to form the array substrate of the FFS mode LCD panel. However, this conventional method suffers from high manufacturing complexity and high cost.

SUMMARY OF THE INVENTION

It is therefore one of the objectives of the present invention to provide an array substrate of an FFS mode LCD panel and method of manufacturing the same to reduce the complexity of the process and further to cut the cost.

According to the present invention, a method of forming an array substrate of an FFS mode LCD panel is provided. The method includes the following steps. A substrate is provided and a plurality of gate lines, a plurality of gate electrodes, and a common electrode are formed on the substrate by a first photolithographic process. The first photolithographic process includes forming a first conducting layer on the substrate and forming a first patterned photoresist on the first conducting layer; removing the first conducting layer unblocked by the first patterned photoresist to form the gate lines and the gate electrodes on the substrate; forming a first transparent conducting layer covering the substrate and the first patterned photoresist; and removing the first patterned photoresist as well as the first transparent conducting layer covering the first patterned photoresist to form the common electrode on the substrate. Subsequently, a gate insulating layer is formed covering the substrate, the gate lines, the gate electrodes, and the common electrode. A patterned semiconductor layer is then formed on the gate insulating layer by a second photolithographic process. A plurality of data lines, a plurality of source electrodes and a plurality of drain electrodes are formed on the gate insulating layer and the semiconductor layer by a third photolithographic process. A plurality of pixel electrodes are formed on the gate insulating layer by a fourth photolithographic process, wherein each of the pixel electrodes is in contact with the corresponding drain electrode for being electrically connected to the corresponding drain electrode. A passivation layer is then formed on the gate insulating layer, the data lines, the source electrodes, the drain electrodes, and the pixel electrodes by a fifth photolithographic process, wherein the passivation layer has a plurality of first openings, and each of the first openings at least partially exposes the pixel electrode.

According to the present invention, an array substrate of an FFS mode LCD panel is provided. The array substrate of the FFS mode LCD panel includes a substrate, a gate line disposed on the substrate, a data line disposed on the substrate, and a thin film transistor disposed on the substrate. The thin film transistor includes a gate electrode electrically connected to the gate line, a gate insulating layer disposed on the gate electrode, a patterned semiconductor layer disposed on the gate insulating layer, a source electrode and a drain electrode disposed on the patterned semiconductor layer, wherein the source electrode is electrically connected to the data line. The array substrate of the FFS mode LCD panel further includes a common electrode disposed between the substrate and the gate insulating layer, a pixel electrode disposed on the gate insulating layer, and a passivation layer disposed on the pixel electrode. The common electrode and the gate electrode are coplanar. The pixel electrode is electrically connected to the drain electrode. The passivation layer has a first opening at least partially exposing the pixel electrode.

In the present invention, the common electrode, the gate line, and the gate electrode are formed by one photolithographic process for reducing manufacturing steps. Additionally, the pixel electrode is covered by the passivation layer and partially exposed by the opening of the passivation layer. The performance of driving liquid crystal molecules in the FFS mode LCD panel may be therefore enhanced, because the thickness of insulating materials between the pixel electrode and the common electrode is reduced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, the preferred embodiments will be made in detail. The preferred embodiments of the present invention are illustrated in the accompanying drawings with numbered elements. In addition, the terms such as "first" and "second" described in the present invention are used to distinguish different components or processes, which do not limit the sequence of the components or processes.

Figure 1:
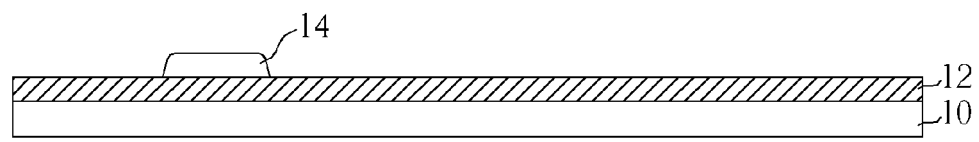
FIGS. 1-13 are schematic diagrams illustrating a method of forming an array substrate of an FFS mode LCD panel according to the first preferred embodiment of the present invention.
Figure 2:
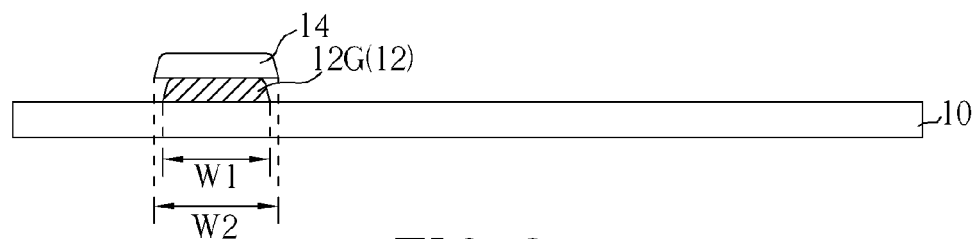
Figure 3:
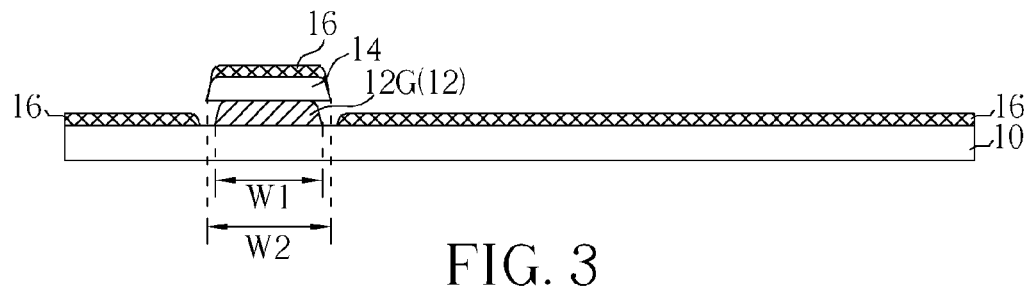

Please refer to FIGS. 1-13. FIGS. 1-13 are schematic diagrams illustrating a method of forming an array substrate of an FFS mode LCD panel according to the first preferred embodiment of the present invention. FIGS. 1-3 are cross-sectional view diagrams, FIG. 4, FIG. 6, FIG. 8, FIG. 10 and FIG. 12 are top-view diagrams, and FIG. 5, FIG. 7, FIG. 9, FIG. 11 and FIG. 13 are cross-sectional view diagrams taken along cross-sectional lines I-I', II-II', III-III' and IV-IV'. As shown in FIG. 1, a substrate (also referred to as lower substrate) 10 is provided. The substrate 10 may be a transparent substrate, e.g. a glass substrate, a plastic substrate, or a quartz substrate, but not limited thereto. Subsequently, a first photolithographic process including the following steps is performed. First, a first conducting layer 12 is formed on the substrate 10. The first conducting layer 12 is made of conducting material, e.g. metal such as aluminum (Al), copper (Cu), molybdenum (Mo), but not limited thereto. In another preferred embodiment, for example, the first conducting layer 12 may also be a composite-layered structure, e.g. a Mo/Al/Mo structure, a Mo/Al structure or a multiple-layered Al structure, but not limited thereto. Then, a first patterned photoresist 14 is formed on the first conducting layer 12 to block portions of the first conducting layer 12, wherein the portions blocked by the first patterned photoresist 14 may be used to form the gate lines, gate electrodes, the gate pad electrodes, and the common line. In this embodiment, the first patterned photoresist 14 may be, for instance, patterned by an exposure process with a photomask (also referred to reticle) (not shown). As shown in FIG. 2, the first conducting layer 12 unblocked by the first patterned photoresist 14 is then removed, for instance by etching, to form a plurality of gate lines (not shown in FIG. 2), a plurality of gate electrodes 12G, and a plurality of gate pad electrodes 12P (not shown in FIG. 2) on the substrate 10. Each of the gate pad electrodes is connected to an end of the corresponding gate line. It is preferable in this embodiment that the first conducting layer 12 is etched, for instance, by controlling etching parameters such that the width of each of the gate lines is smaller than the width of the first patterned photoresist 14 disposed thereon, the width of each of the gate electrodes 12G is smaller than the width of the first patterned photoresist 14 disposed thereon, and the width of each of the gate pad electrodes is smaller than the width of the first patterned photoresist 14 disposed thereon. As shown in FIG. 2, for instance, the width W1 of the gate electrode 12G is smaller than the width W2 of the first patterned photoresist 14. The etching parameters that can be used to control the width of the gate line and the width of the gate electrode 12G may be, for example, the concentration of etching solution, the etching time, the process temperature, and the process pressure, but not limited thereto.

Figure 4:
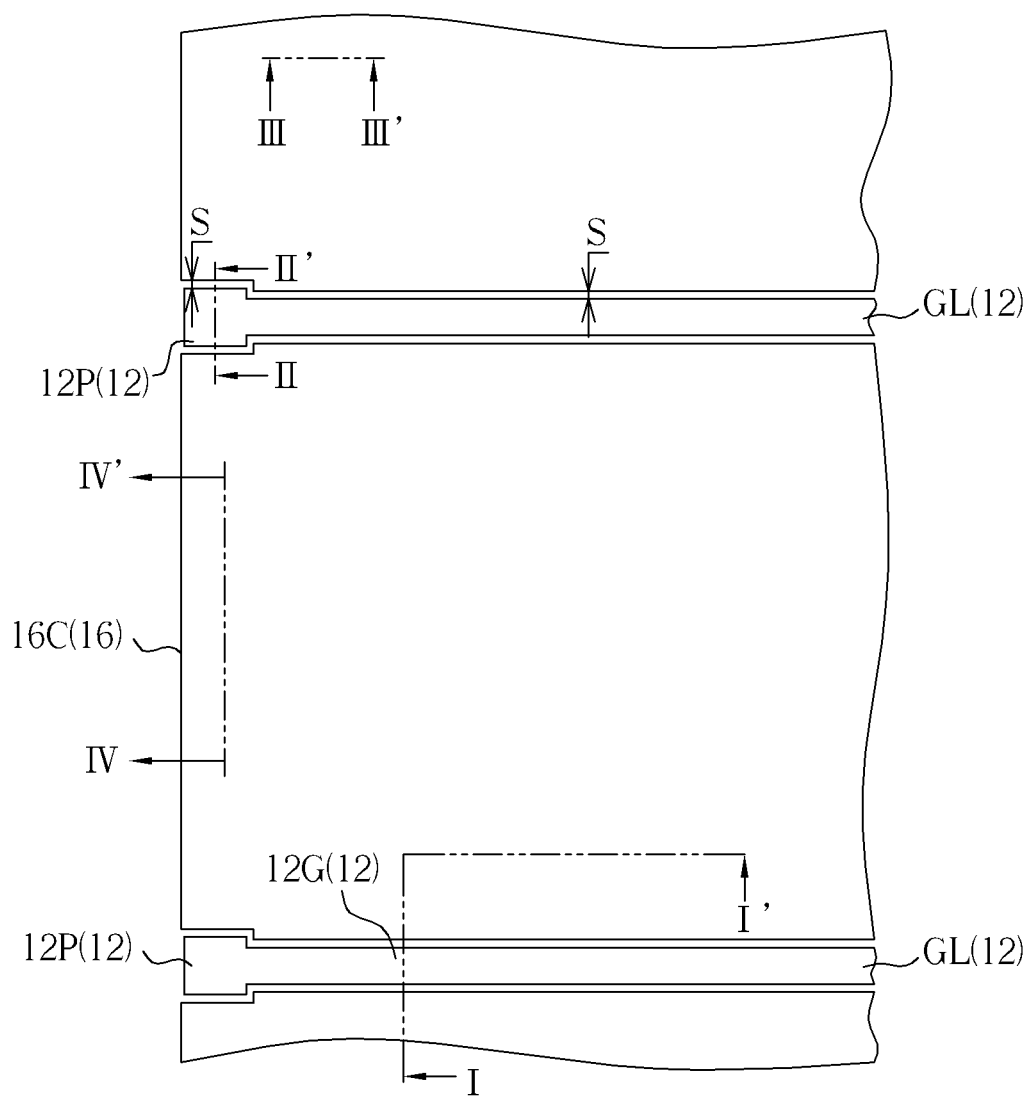
Figure 5:
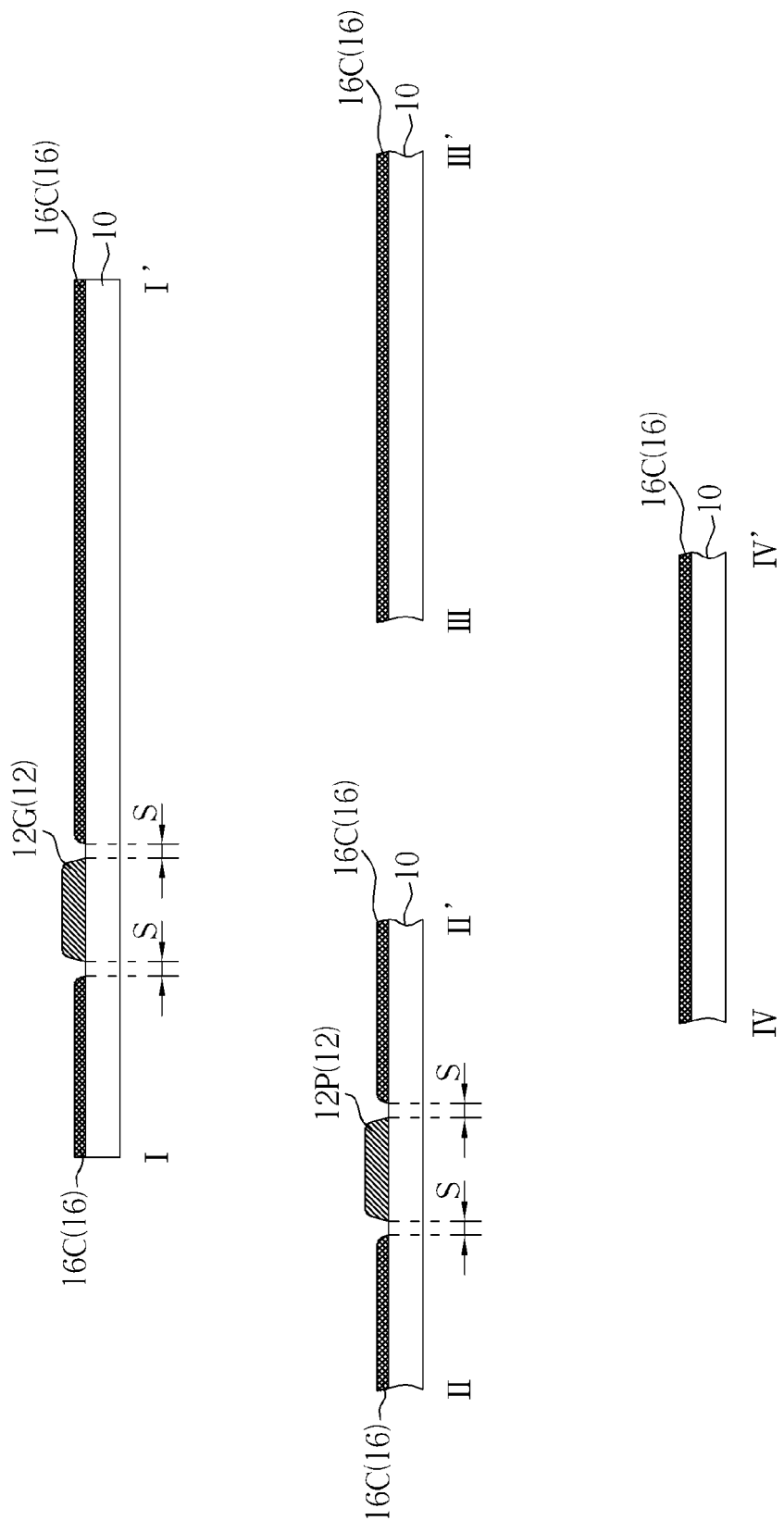

After the gate lines, the gate electrodes 12G, and the gate pad electrodes are formed, a first transparent conducting layer 16 is formed covering the substrate 10 and the first patterned photoresist 14 as shown in FIG. 3. The first transparent conducting layer 16 is made of any suitable transparent conducting material such as ITO or IZO (indium zinc oxide), but not limited thereto. As shown in FIGS. 4 and 5, the first patterned photoresist 14 as well as the first transparent conducting layer 16 covering the first patterned photoresist 14 are stripped altogether to form a common electrode 16C on the substrate 10. It can be seen that the common electrode 16C is patterned by the same first patterned photoresist 14 used to form the gate lines GL, the gate electrodes 12G, and the gate pad electrodes 12P, as a result, no extra photolithographic process is required to pattern the common electrode 16C. Accordingly, the common electrode 16C, the gate electrodes 12G, the gate lines GL, and the gate pad electrodes 12P are coplanar, i.e. the common electrode 16C, the gate lines GL, the gate electrodes 12G, and the gate pad electrodes 12P are disposed on the same layer. Also, since the width of each of the gate lines GL is smaller than the width of the first patterned photoresist 14 disposed thereon, the width of each of the gate electrodes 12G is smaller than the width of the first patterned photoresist 14 disposed thereon, and the width of each of the gate pad electrodes 12P is smaller than the width of the first patterned photoresist 14 disposed thereon, a gap S between the common electrode 16C and the gate lines GL, a gap S between the common electrode 16C and the gate electrodes 12G, and a gap S between the common electrode 16C and the gate pad electrodes 12P are simultaneously created. As a result of said gap S, the common electrode 16C is ensured to be insulated from the gate lines GL, the gate electrodes 12G, and the gate pad electrodes 12P. In this embodiment, the gap S between the gate line GL and the common electrode 16C, and the gap S between the gate electrodes 12G and the common electrode 16C, and the gap S between the gate pad electrode 12P and the common electrode 16C are preferably ranged from 0.2 micrometers to 2 micrometers, but not limited thereto. The above range of the gap S is preferable for the following reasons. When the gap S is smaller than 0.2 micrometers, short circuit tends to occur between the common electrode 16C and the gate line GL or the gate electrode 12G/the gate pad electrode 12P. When the gap S is larger than 2 micrometers, more process time to etch the first conducting layer 12 is required. The larger the gap S is, the smaller the aperture ratio becomes because a relatively large area of black matrix (not shown) will be necessarily applied to the LCD to avoid light leakage caused by the larger gap S. In other words, a smaller gap S will need a smaller black matrix causing less impact to the aperture ratio.

Figure 6:
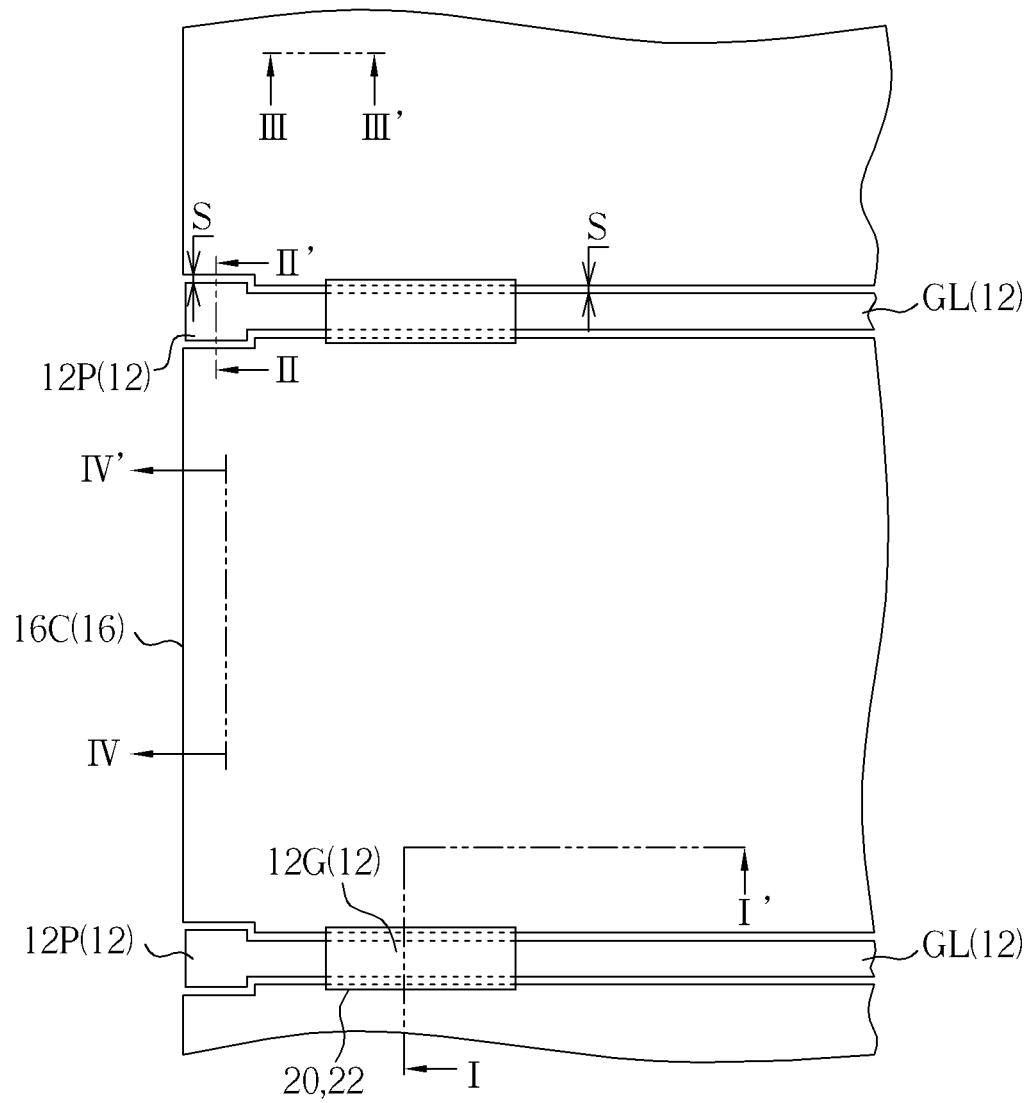
Figure 7:
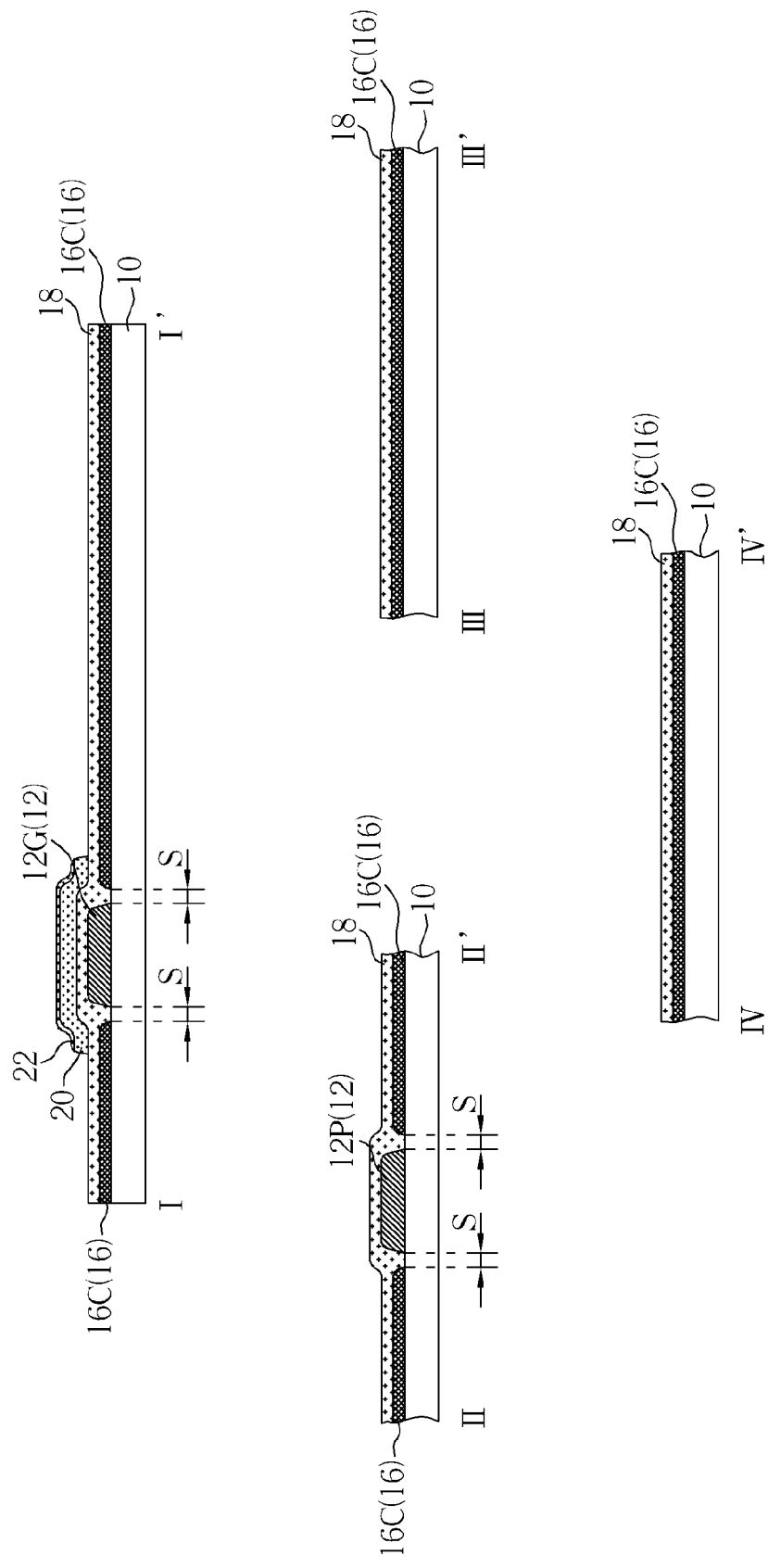

As shown in FIGS. 6 and 7, a gate insulating layer 18 (not shown in FIG. 6) is then formed to cover the substrate 10, the gate lines GL, the gate electrodes 12G, the gate pad electrode 12P, and the common electrode 16C. The gate insulating layer 18 is made of dielectric material, e.g. silicon oxide, silicon nitride or silicon oxynitride, but not limited thereto. Subsequently, a second photolithographic process is performed to form a patterned semiconductor layer 20 on the gate insulating layer 18. The patterned semiconductor layer 20 is disposed substantially corresponding to the gate electrodes 12G, and serves as a channel layer. It is noted that in order to improve the ohmic contact between the patterned semiconductor layer 20 and the source/drain to be formed in the next process, a patterned ohmic contact layer 22 can be optionally formed on the patterned semiconductor layer 20 and patterned along with the patterned semiconductor layer 20 by the second photolithographic process. The patterned semiconductor layer 20 and the patterned ohmic contact layer 22 may be both made of semiconductor material such as amorphous silicon, but not limited thereto. The patterned ohmic contact layer 22 is heavily doped, for example n-type (N+), while the patterned semiconductor layer 20 is lightly doped.

Figure 8:
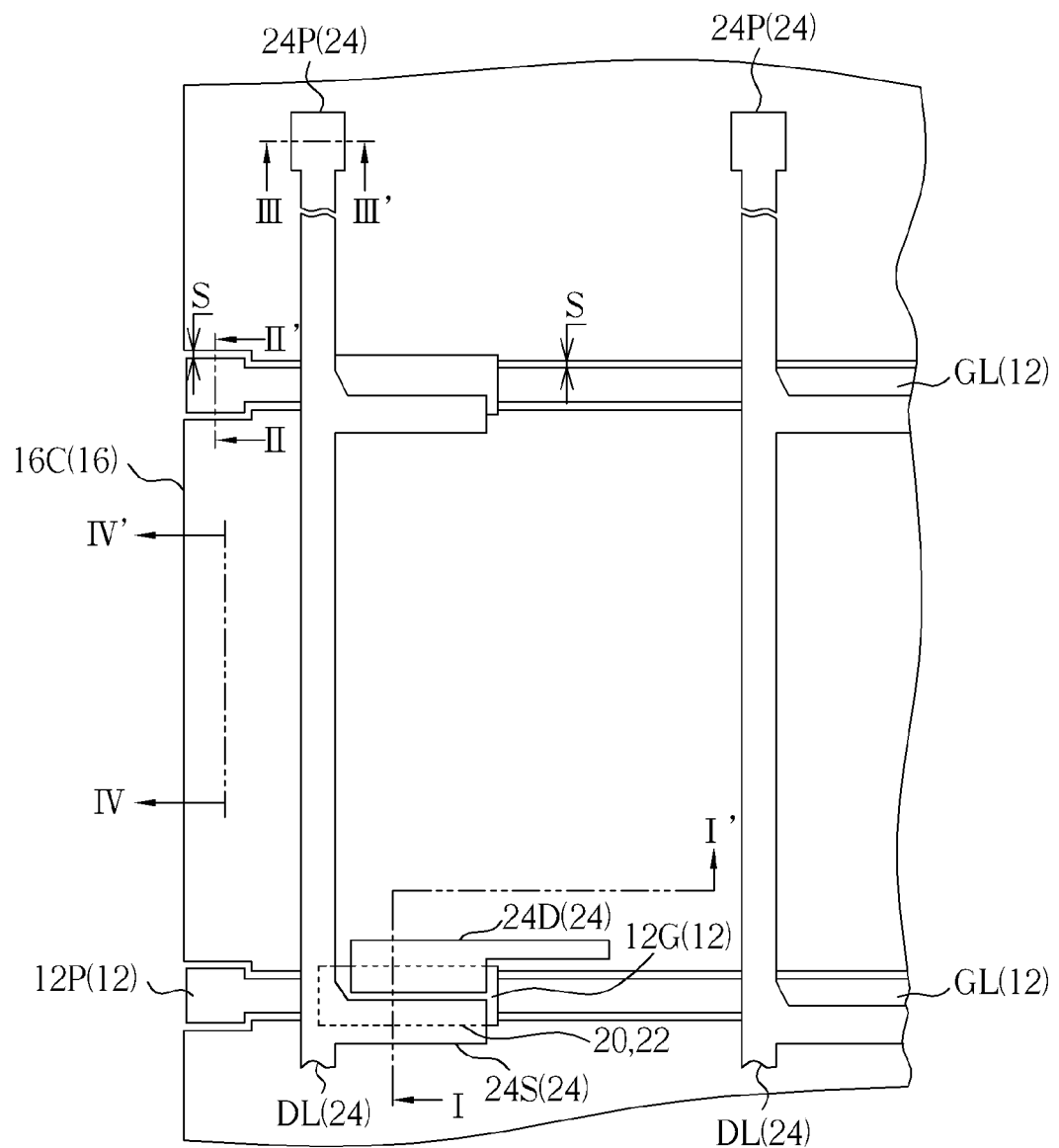
Figure 9:
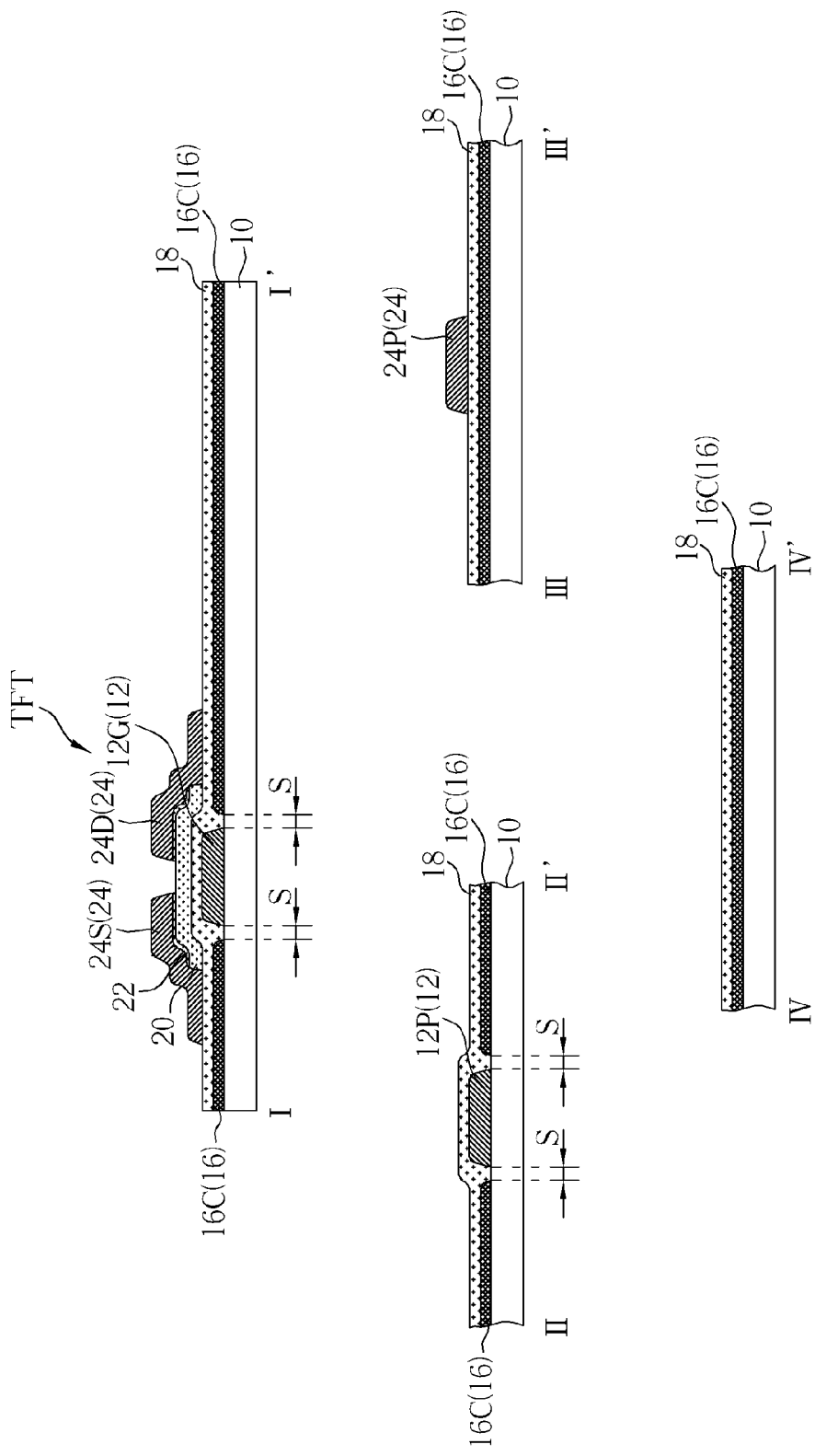

As shown in FIGS. 8 and 9, a second conducting layer 24 is formed on the gate insulating layer 18, the patterned semiconductor layer 20, and the patterned ohmic contact layer 22. The second conducting layer 24 is made of conducting material, e.g. metal such as Al, Cu, Mo, but not limited thereto. In the preferred embodiment, for example, the conducting material may also be a composite-layered structure, e.g. a Mo/Al/Mo structure, a Mo/Al structure, or a multiple-layered Al structure, but not limited thereto. Subsequently, a third photolithographic process is performed to pattern the second conducting layer 24 to form a plurality of data lines DL, a plurality of source electrodes 24S, a plurality of drain electrodes 24D, and a plurality of data pad lower electrodes 24P on the gate insulating layer 18. The data lines DL are arranged perpendicularly to the gate lines GL, forming a plurality of sub-pixel regions. Each of the source electrodes 24S and the corresponding drain electrodes 24D at least partially cover two opposite sides of the corresponding semiconductor layer 20, forming a thin film transistor TFT with the corresponding gate electrode 12G. Each of the data pad lower electrodes 24P is connected to an end of the corresponding data line DL. It is appreciated that in the third photolithographic process, the patterned ohmic contact layer 22 is patterned again so that the patterned ohmic contact layer 22 is disposed corresponding to the source electrodes 24S and the drain electrodes 24D, i.e. the patterned ohmic contact layer 22 is located between the patterned semiconductor layer 20 and the source electrodes 24S, and between the patterned semiconductor layer 20 and the drain electrodes 24D for forming the ohmic contact between the patterned semiconductor layer 20 and the source electrodes 24S or drain electrodes 24D.

Figure 10:
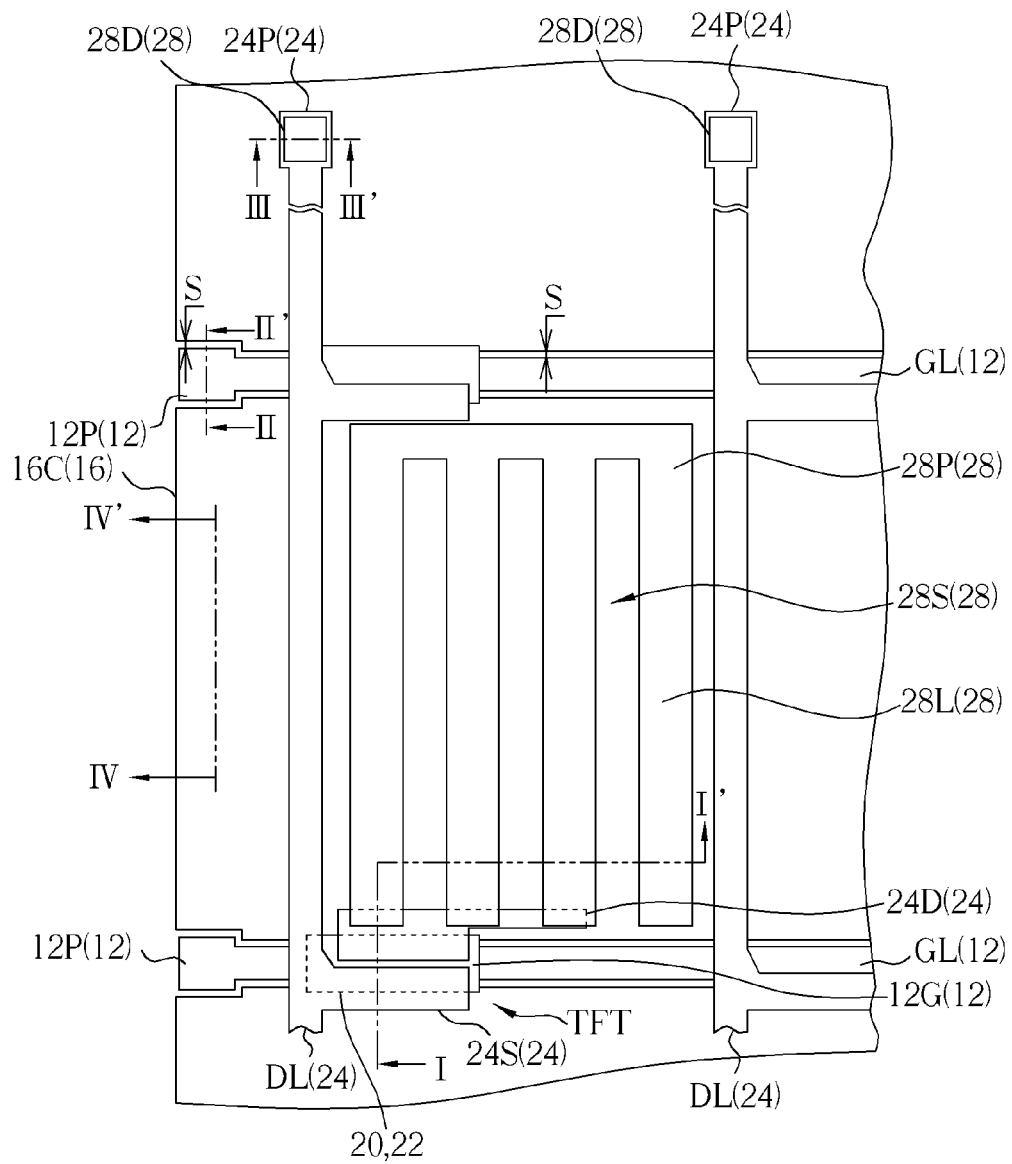
Figure 11:
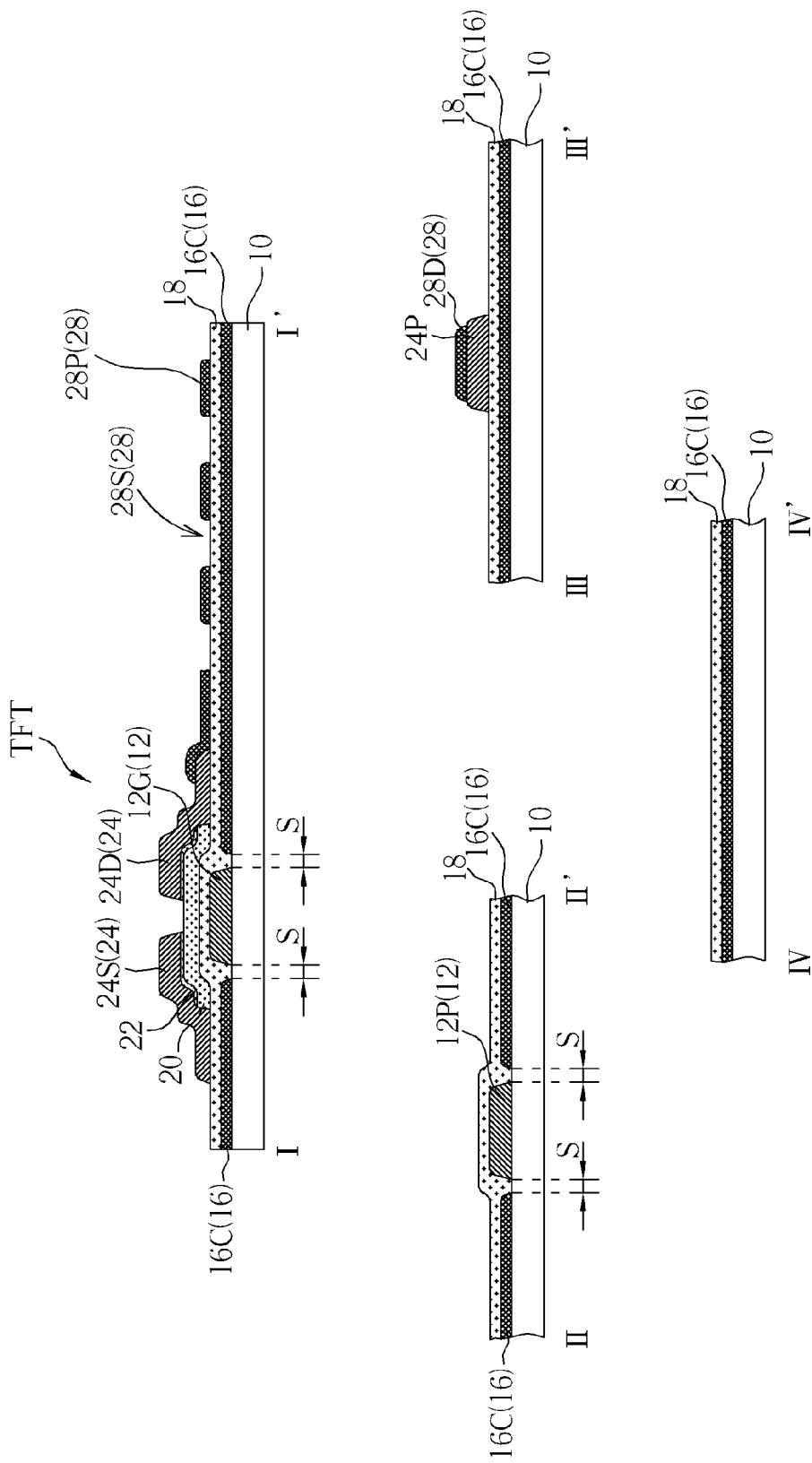

As shown in FIGS. 10 and 11, a second transparent conducting layer 28 is formed on the gate insulating layer 18. The second transparent conducting layer 28 is made of any suitable transparent conducting material such as ITO or IZO, but not limited thereto. Subsequently, a fourth photolithographic process is performed to pattern the second transparent conducting layer 28 to form a plurality of pixel electrodes 28P and a plurality of data pad upper electrodes 28D on the gate insulating layer 18. In other words, the data pad upper electrodes 28D and the pixel electrodes 28P may be made of the same transparent conducting material. Each of the pixel electrodes 28P is disposed corresponding to the sub-pixel region, and each of the pixel electrodes 28P is in contact with the corresponding drain electrode 24D for being electrically connected to the corresponding drain electrode 24D. Each of the data pad upper electrodes 28D is in contact with the corresponding data pad lower electrode 24P for being electrically connected to the corresponding data pad lower electrode 24P. It is worth noticing that because the pixel electrode 28P is in contact with the drain electrode 24D without utilizing any contact holes, predetermined areas for connecting the drain electrode 24D to the pixel electrode 28P may become smaller for increasing aperture ratio of the sub-pixel region. In addition, each of the pixel electrodes 28P has a plurality of stripe electrodes 28L arranged in parallel and electrically connected together, and a plurality of slits 28S arranged between the stripe electrodes 28L, i.e. each of the pixel electrodes 28P has a comb-like shape. The pixel electrode 28P may have any other shapes such as a boomerang-like shape.

Figure 12:
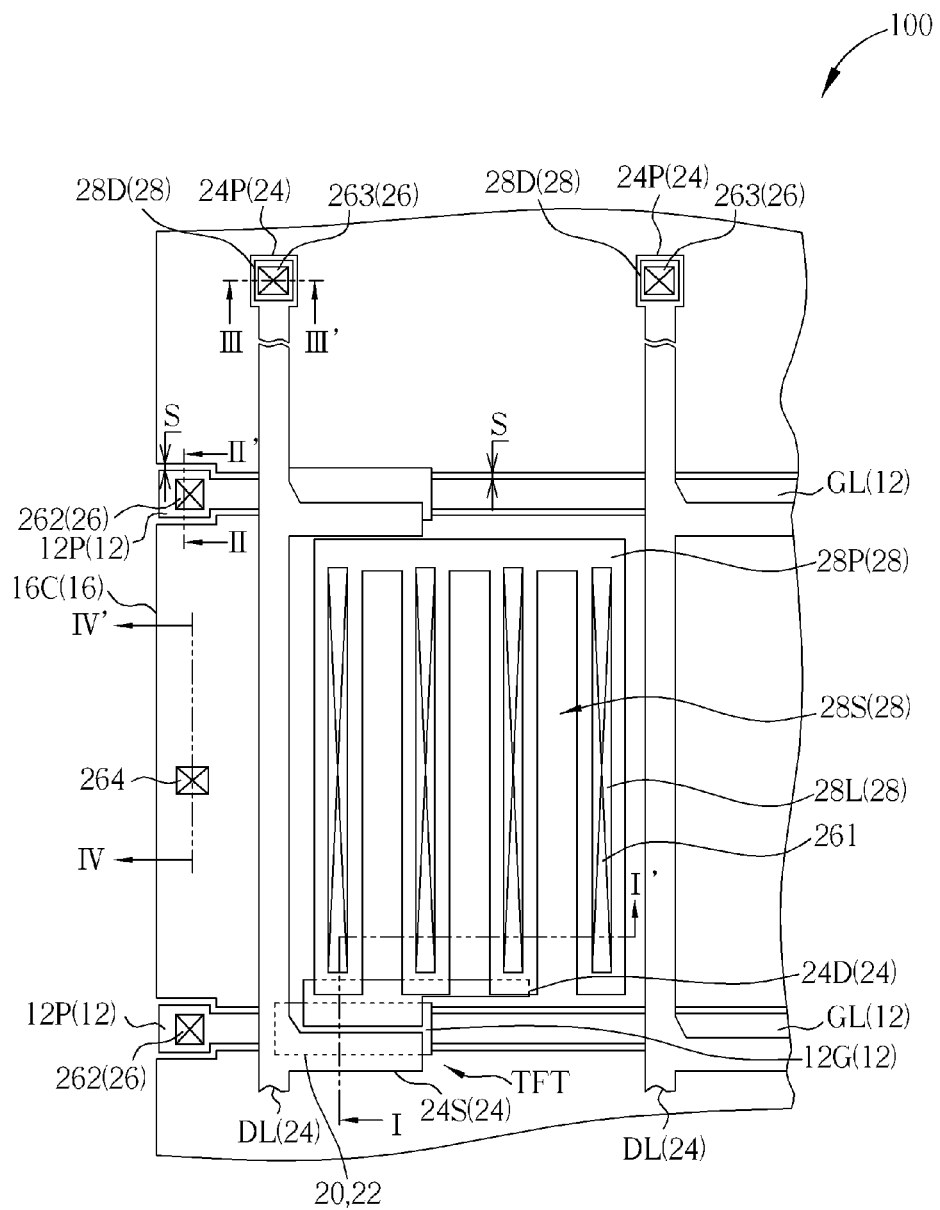
Figure 13:
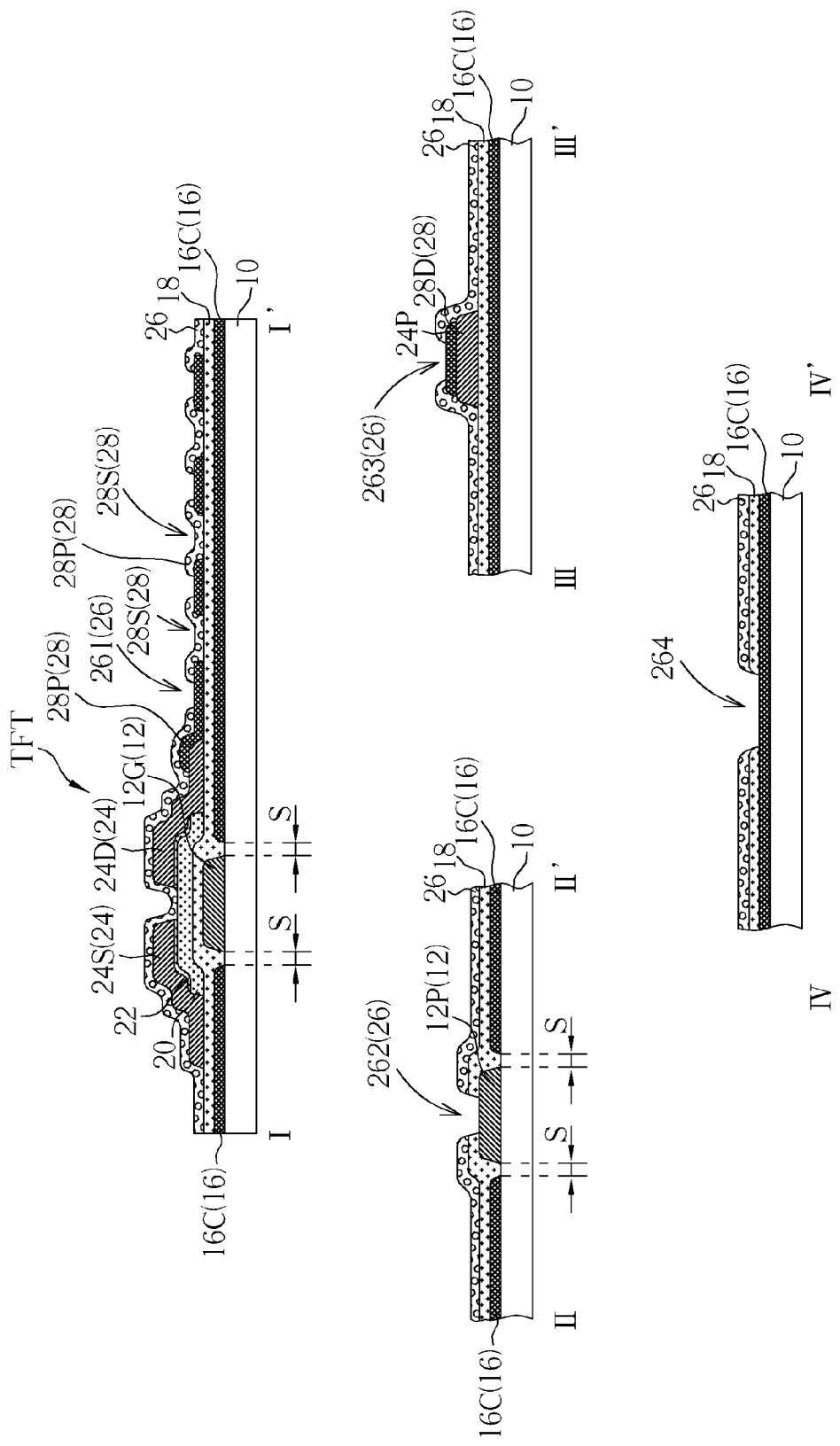

As shown in FIGS. 12 and 13, a passivation layer 26 is then formed on the gate insulating layer 18, the data lines DL, the source electrodes 24S, the drain electrodes 24D, the data pad upper electrodes 28D, and the pixel electrode 28P. The passivation layer 26 may be made of inorganic material, e.g. silicon nitride, or organic material, e.g. acryl resin. A fifth photolithographic process is then performed to pattern the passivation layer 26 to form a plurality of first openings 261, a plurality of second openings 262, a plurality of third openings 263, and a plurality of fourth openings 264. Each of the first openings 261 penetrates through the passivation layer 26 and at least partially exposes the pixel electrodes 28P respectively. Each of the second openings 262 penetrates through the passivation layer 26 and the gate insulating layer 18 and partially exposes the corresponding gate pad electrode 12P. Each of the third openings 263 penetrates through the passivation layer 26 and partially exposes the corresponding data pad upper electrode 28D. Each of the fourth openings 264 penetrates through the passivation layer 26 and the gate insulating layer 18, and partially exposes the common electrode 16C. The pixel electrodes 28P are disposed over the common electrode 16C, and a fringe electric field may be generated between the common electrode 16C and each of the pixel electrodes 28P with the stripe electrodes 28L and the slits 28S. It is worth noticing that each of the pixel electrodes 28P is partially exposed by the first openings 261, and the fringe electric field generated between the common electrode 16C and each of the pixel electrodes 28P may not be interfered by the passivation layer 26 on the pixel electrode 28P. The pixel electrodes 28P exposed by the first openings 261 may be used to absorb foreign ions or impurity ions, and related problems such as image sticking may be improved. In addition, gate signals may be applied via the gate pad electrodes 28G exposed by the second openings 262, and data signal may be applied via the data pad upper electrodes 28D exposed by the third openings 263. The common electrode 16C is partially exposed by the fourth opening 264. In addition, an integrated circuit (not shown) may be electrically connected to the common electrode 16C through the fourth opening 264, and common signals may be applied to the common electrode 16C.

Please refer to FIGS. 12 and 13 again. FIGS. 12 and 13 illustrate an array substrate of an FFS mode LCD panel according to the first preferred embodiment of the present invention, where FIG. 13 is a cross-sectional diagram taken along cross-sectional lines I-I', II-II', III-III' and IV-IV' in FIG. 12. As shown in FIGS. 12 and 13, an array substrate 100 includes a substrate 10, a gate line GL disposed on the substrate 10, a data line DL disposed on the substrate 10, a gate pad electrode 12P electrically connected to an end of the gate line GL on the substrate 10, and a thin film transistor TFT disposed on the substrate 10. The thin film transistor TFT includes a gate electrode 12G electrically connected to the gate line GL, a gate insulating layer 18 disposed on the gate electrode 12G, a patterned semiconductor layer 20 disposed on the gate insulating layer 18, and a source electrode 24S and a drain electrode 24D disposed on the patterned semiconductor layer 20. The source electrode 24S is electrically connected to the data line DL. The array substrate 100 further includes a common electrode 16C disposed between the substrate 10 and the gate insulating layer 18. The gate electrode 12G, the gate pad electrode 12P, and the gate line GL are made of the same conducting material. The common electrode 16C, the gate electrode 12G, the gate line GL, and the gate pad electrode 12P are coplanar. Specifically, the common electrode 16C, the gate line GL, the gate electrode 12G, and the gate pad electrode 12P are disposed on the same layer. There is a gap S between the gate line GL and the common electrode 16C, a gap S between the gate electrode 12G and the common electrode 16C, and a gap S between the gate pad electrode 12P and the common electrode 16C. In this embodiment, the gap S is substantially between 0.2 micrometers and 2 micrometers, but not limited thereto. The array substrate 100 further includes a data pad lower electrode 24P electrically connected to an end of the data line DL, and the data pad lower electrode 24P, the data line DL, the source electrode 24S and the drain electrode 24D are made of the same conducting material. The array substrate 100 further includes a pixel electrode 28P and a data pad upper electrode 28D made of the same transparent conducting material and disposed on the gate insulating layer 18. The pixel electrode 28P is in contact with the drain electrode 24D for being electrically connected to the drain electrode 24D. The data pad upper electrode 28D is in contact with the data pad lower electrode 24P for being electrically connected to the data pad lower electrode 24P. The pixel electrode 28P has a plurality of stripe electrodes 28L arranged in parallel and electrically connected together, and a plurality of slits 28S arranged between the stripe electrodes 28L. A passivation layer 26 is disposed on the gate insulating layer 18 and the pixel electrodes 28P. The passivation layer 26 has a first opening 261 at least partially exposing the pixel electrode 28P, a second opening 262 partially exposing the gate pad electrode 12P, a third opening 263 partially exposing the data pad upper electrode 28D, and a fourth opening 264 partially exposing the common electrode 16C. In this embodiment, each of the first openings is disposed correspondingly to each of the stripe electrodes 28L, but the first opening 261 of the present invention is not limited to this and may be disposed correspondingly to two or more stripe electrodes 28L of one pixel electrode 28P. In other words, one first opening 261 may partially expose one or more stripe electrodes 28L of one pixel electrode 28P.

The following description will detail the different embodiments of the array substrate of the FFS mode LCD panel and the manufacturing method thereof in the present invention. To simplify the description, the identical components in each of the following embodiments are marked with identical symbols. For making it easier to compare the difference between the embodiments, the following description will detail the dissimilarities among different embodiments and the identical features will not be redundantly described.

Figure 14:
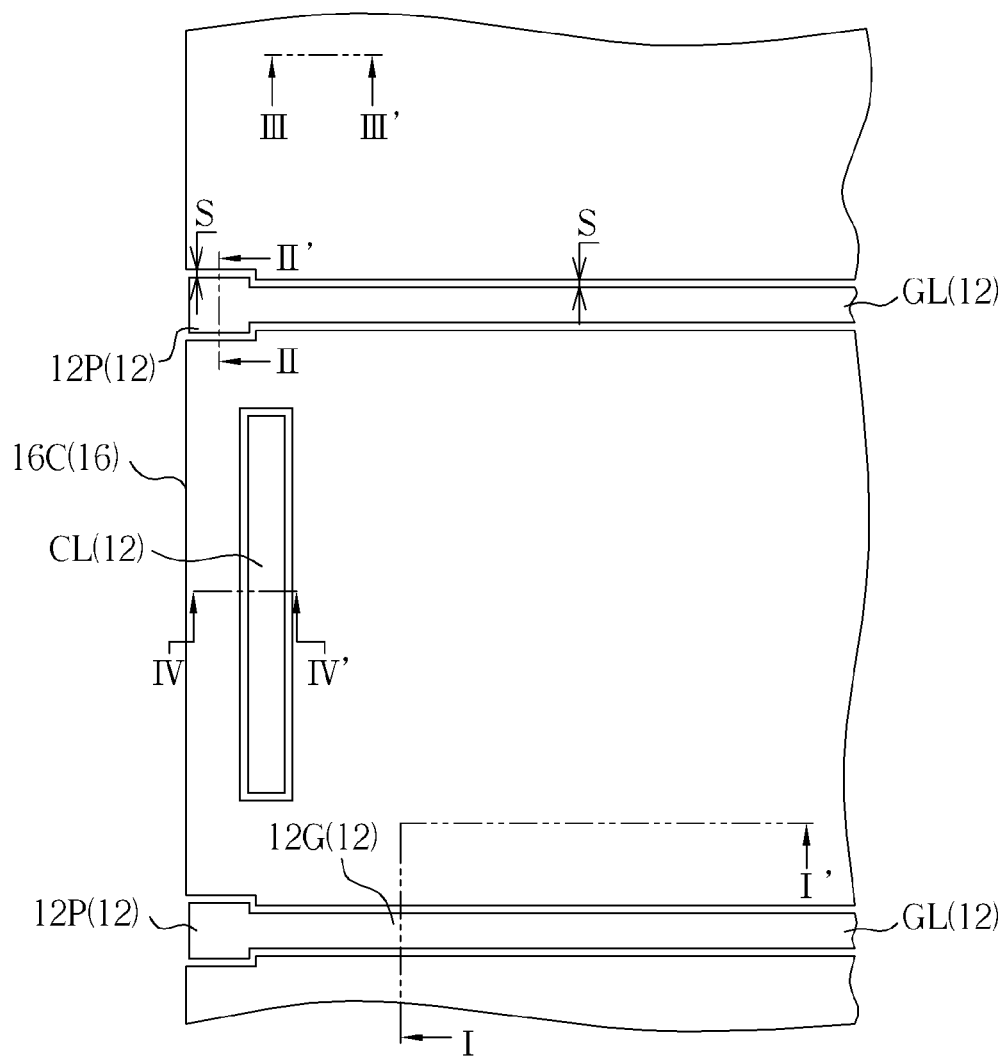
FIGS. 14-25 are schematic diagrams illustrating a method of forming an array substrate of an FFS mode LCD panel according to the second preferred embodiment of the present invention.
Figure 15:
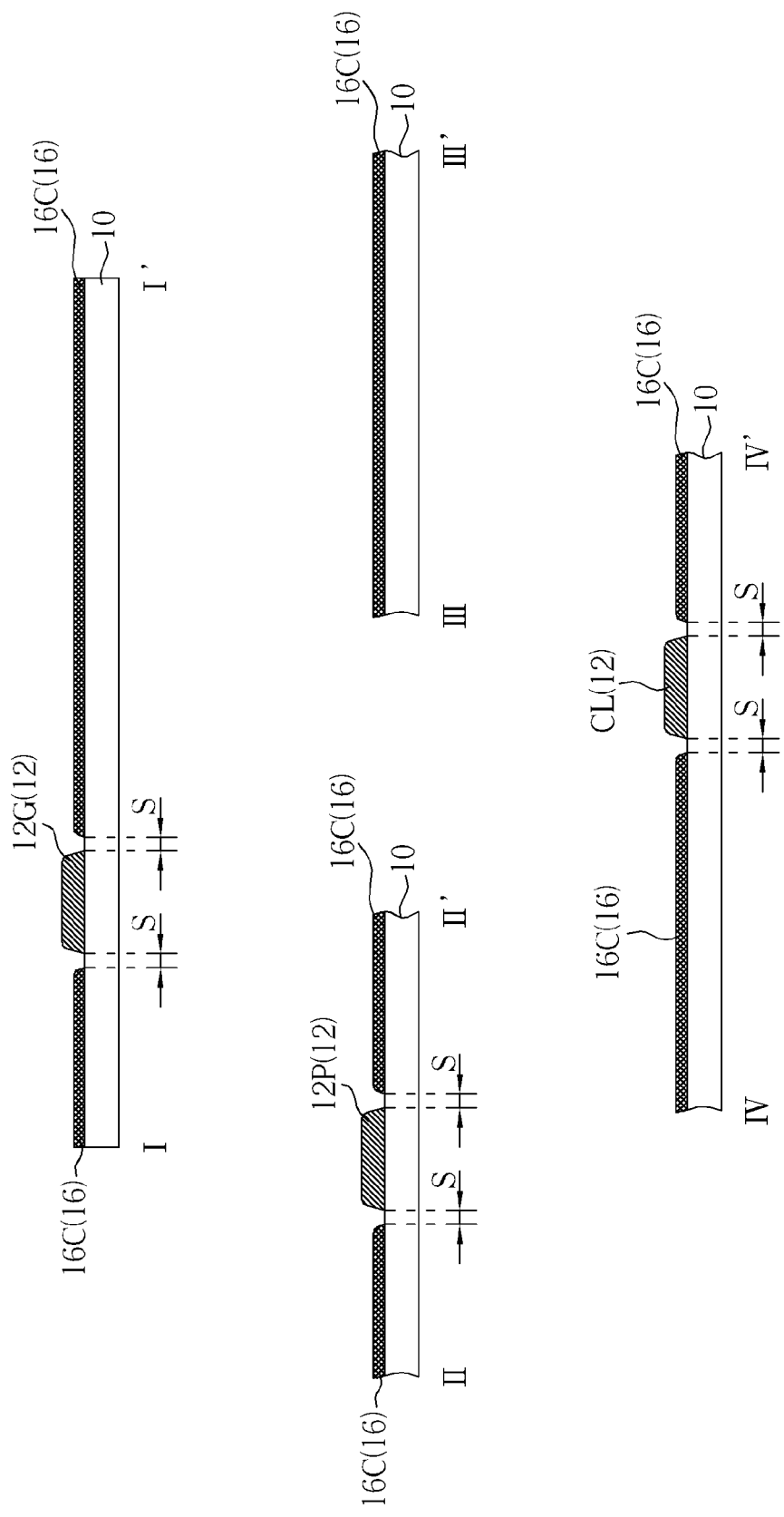
Figure 16:
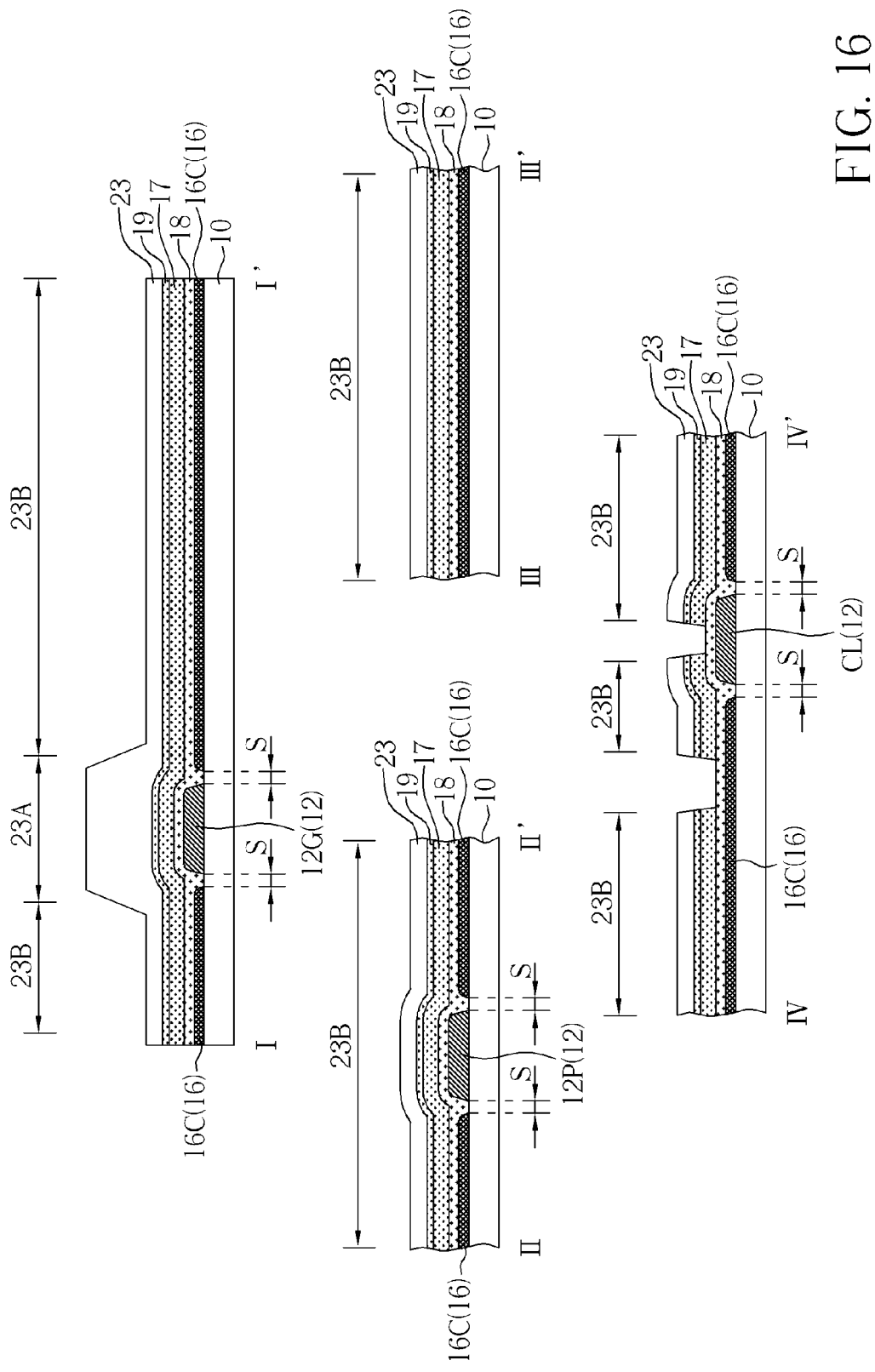
Figure 17:
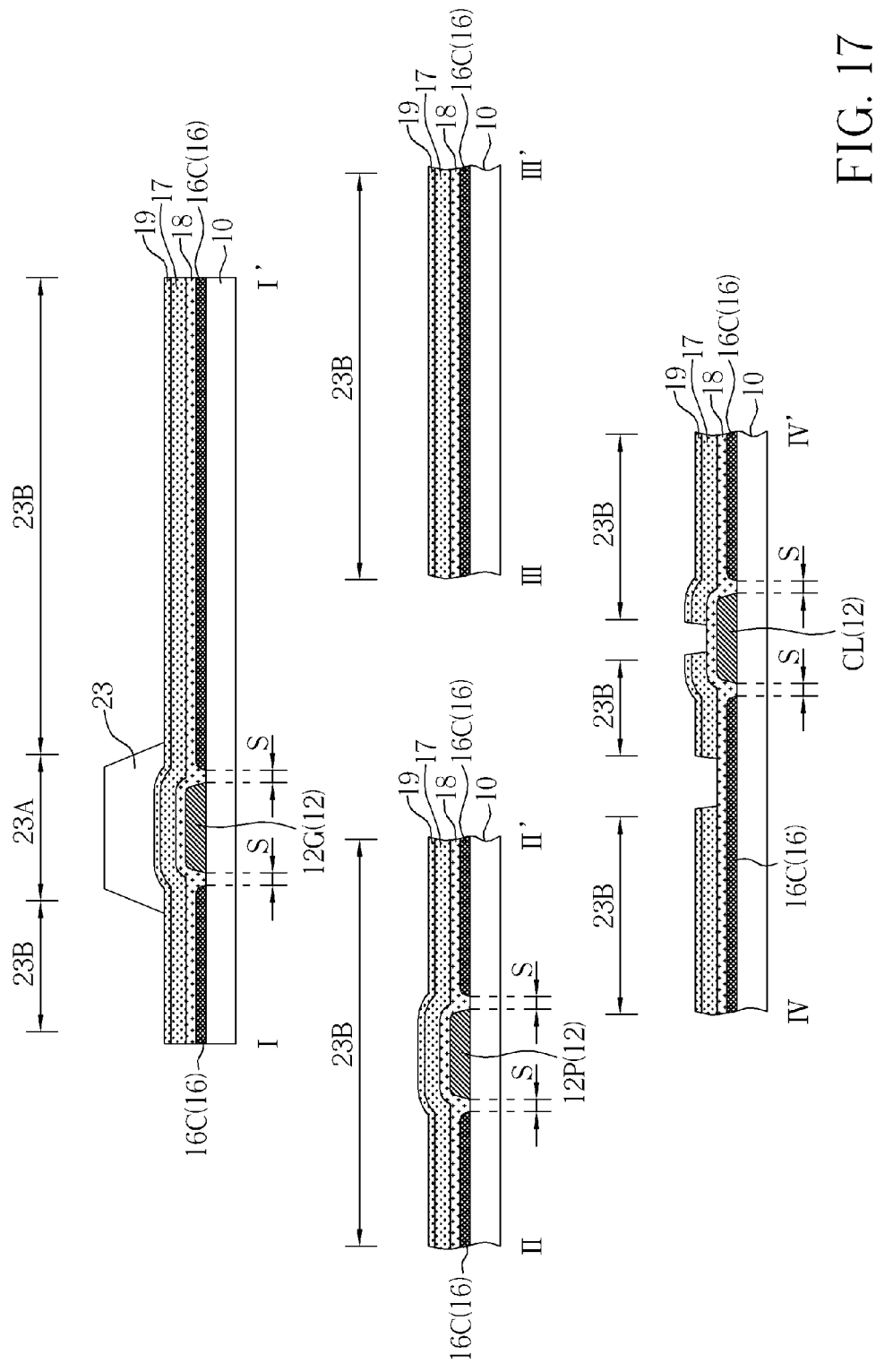
Figure 18:
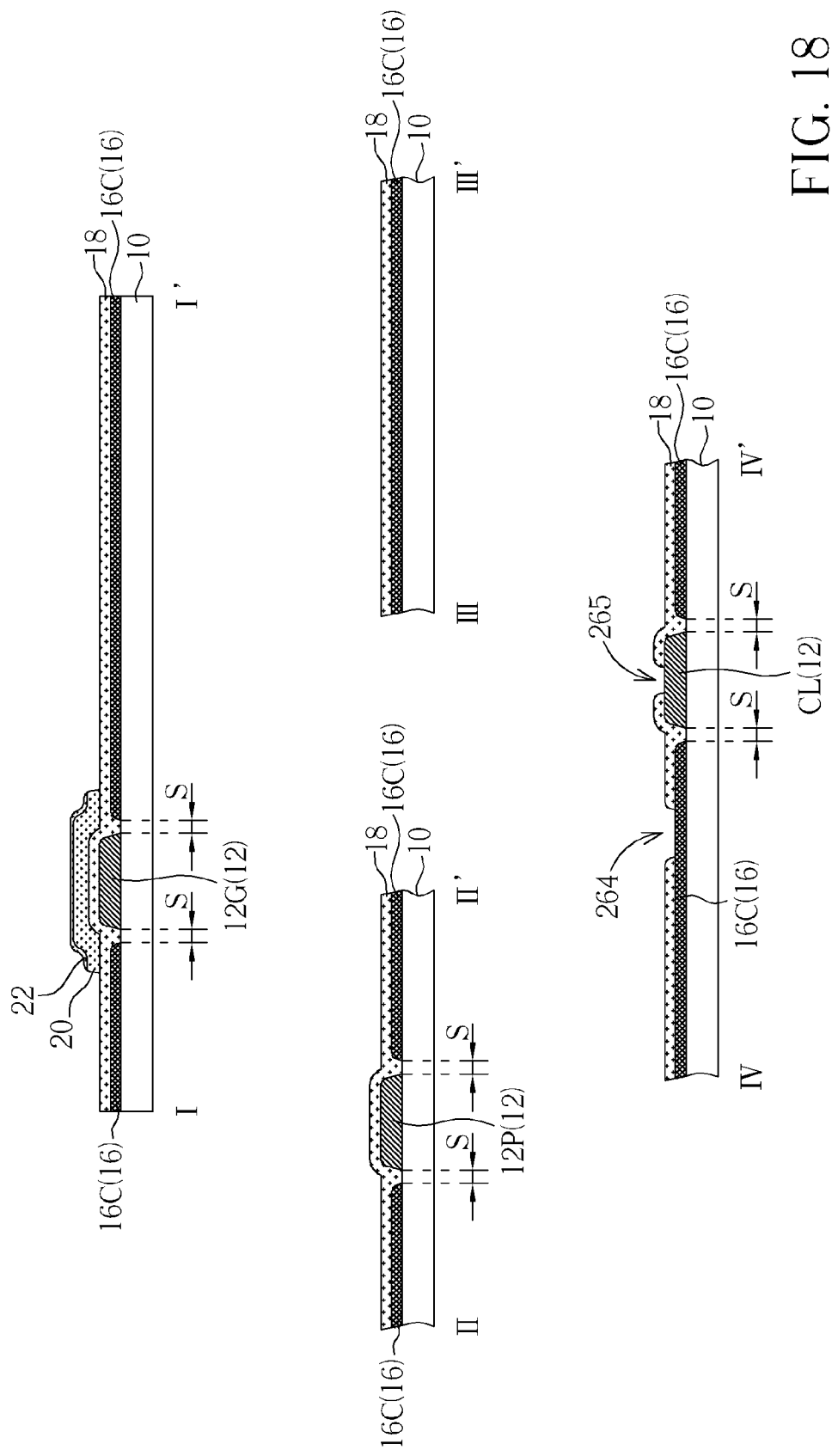
Figure 19:
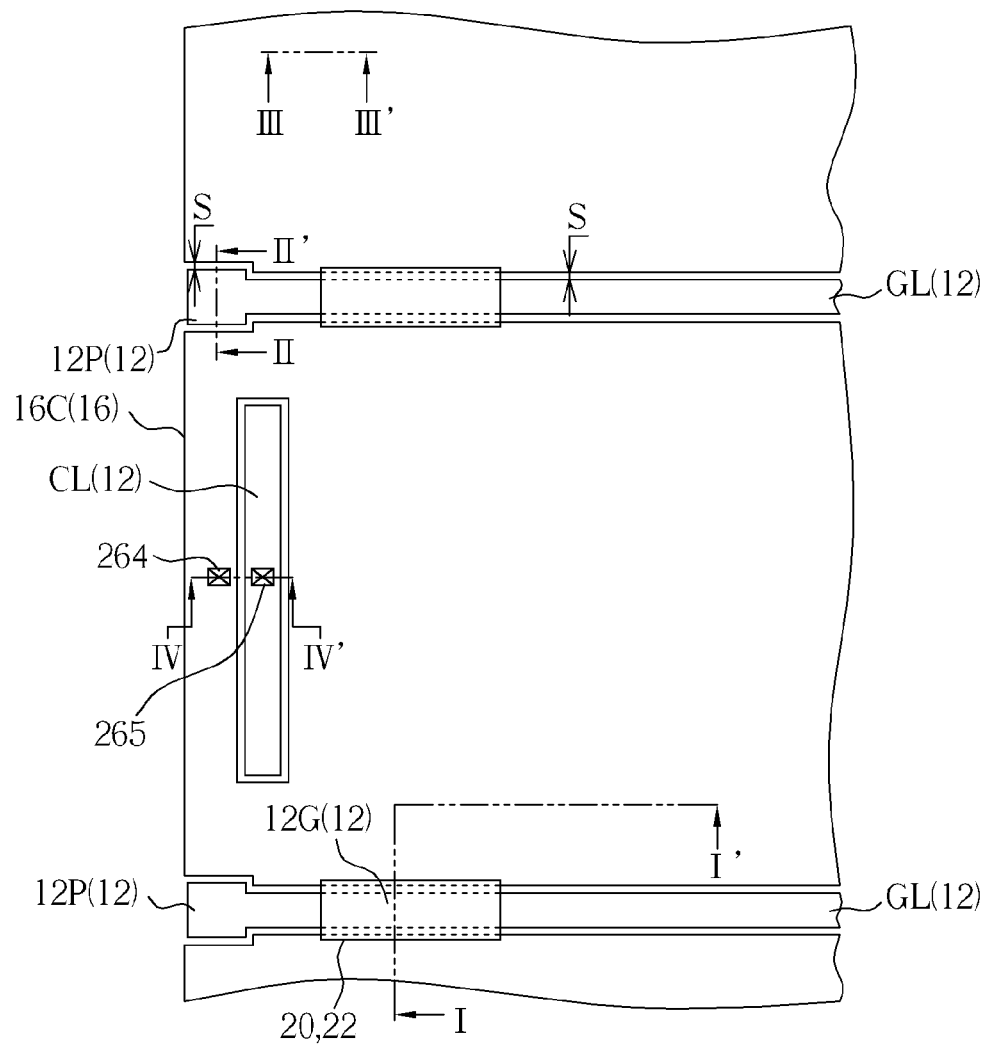

Please refer to FIGS. 14-25, and refer to FIGS. 1-13 together. FIGS. 14-25 are schematic diagrams illustrating a method of forming an array substrate of an FFS mode LCD panel according to the second preferred embodiment of the present invention. FIG. 14, FIG. 19, FIG. 20, FIG. 22, and FIG. 24 are top-view diagrams, and FIG. 15, FIG. 16, FIG. 17, FIG. 18, FIG. 21, FIG. 23, and FIG. 25 are cross-sectional view diagrams taken along cross-sectional lines I-I', II-II', III-III' and IV-IV'. As shown in FIG. 14 and FIG. 15, in this embodiment, the first conducting layer 12 may be used to form the gate lines GL, gate electrodes 12G, the gate pad electrodes 12P, and a common line CL, i.e. the common line CL is formed by the first photolithographic process of this embodiment. Except for forming the common line CL, the first photolithographic process of this embodiment is similar to the first photolithographic process of the first preferred embodiment detailed above and will not be redundantly described.

As shown in FIGS. 16-19, a gate insulating layer 18 is then formed to cover the substrate 10, the gate lines GL, the gate electrodes 12G, the gate pad electrode 12P, the common line CL and the common electrode 16C. Subsequently, a second photolithographic process including the following steps is performed. First, a semiconductor layer 17 is formed on the gate insulating layer 18. An ohmic contact layer 19 may be optionally formed on the semiconductor layer 17. Then, a second patterned photoresist 23 is formed on the ohmic contact layer 19 to block portions of the ohmic contact layer 19 and the semiconductor layer 17. It is worth noticing that, in this embodiment, the second patterned photoresist 23 includes a first thickness region 23A and a second thickness region 23B, and a thickness of the second thickness region 23B is smaller than a thickness of the first thickness region 23A. The thickness difference between the first thickness region 23A and the second thickness region 23B may be formed by an exposure process with a multi-tone photomask (also referred to reticle) (not shown), wherein the multi-tone photomask includes at least three different regions with different transmittances to exposure energy, but the thickness difference between the first thickness region 23A and the second thickness region of the second patterned photoresist 23 is not limited to this and may be formed by other appropriate methods. After forming the second patterned photoresist 23, at least a part of the ohmic contact layer 19 and at least a part of the semiconductor layer 17 unblocked by the second patterned photoresist 23 are removed, for instance by etching. It is worth noticing that a part of the gate insulating layer 18 unblocked by the second pattern photoresist 23 may also be removed by etching. Subsequently, the second patterned photoresist 23 is thinned by a thinning process such as an ashing (photoresist ashing, PR ashing) process, but the present invention is not limited to this. The thickness of the second thickness region 23B is still smaller than the thickness of the first thickness region 23A after the ashing process. In this embodiment, the photoresist within the second thickness region 23B is totally removed by the ashing process, and a part of the ohmic contact layer 19 and the semiconductor layer 17 are still covered by the second patterned photoresist 23 within the first thickness region 23A. After the ashing process, the ohmic contact layer 19, the semiconductor layer 17 and a part of the gate insulating layer 18 unblocked by the second patterned photoresist 23 are removed, for instance by etching to form a fourth opening 264, a fifth opening 265, a patterned ohmic contact layer 22, and a patterned semiconductor layer 20. Finally, the second patterned photoresist 23 is removed by a stripping process. The fourth opening 264 partially exposes the common electrode 16C, and the fifth opening 265 partially exposes the common line CL.

Figure 20:
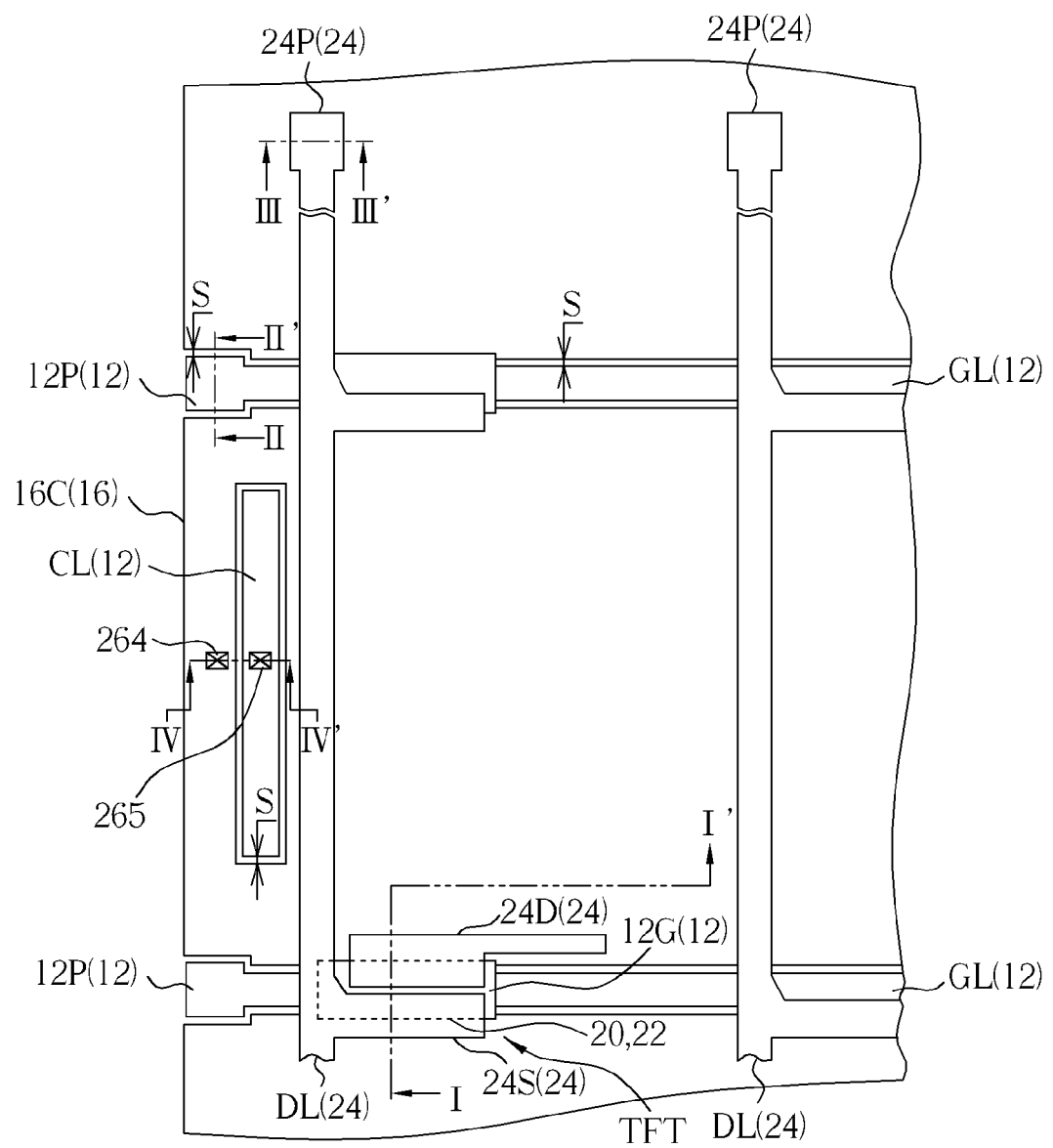
Figure 21:
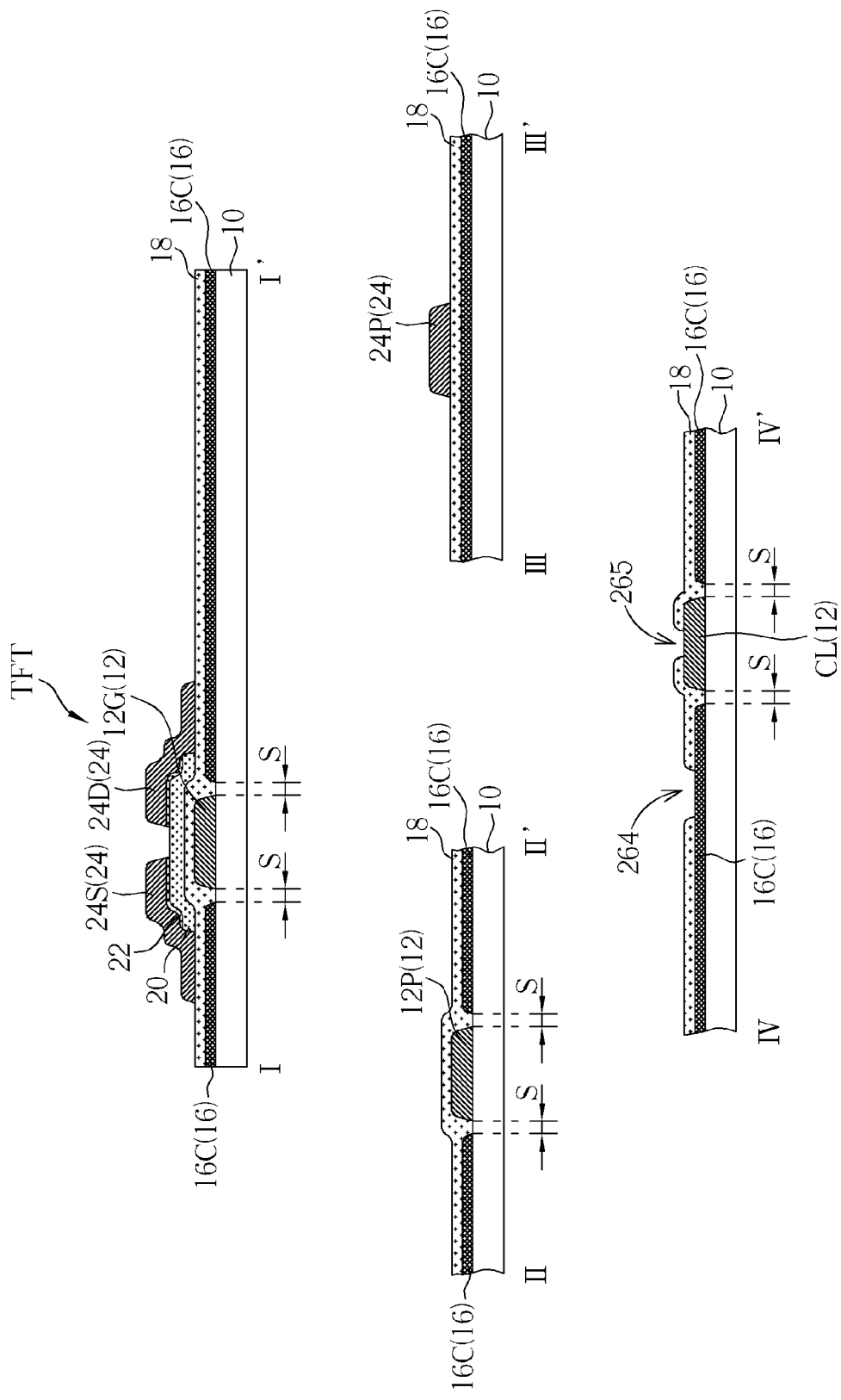

As shown in FIGS. 20 and 21, the data lines DL, the source electrodes 24S, the drain electrodes 24D, and the data pad lower electrodes 24P are formed by a third photolithographic process. The third photolithographic process of this embodiment is similar to the third photolithographic process of the first preferred embodiment detailed above and will not be redundantly described. However, it is worth noticing that because the common electrode 16C and the common line CL are partially exposed by the fourth opening 264 and the fifth opening 265 respectively during the third photolithographic process, an etching process, which is employed to patterned the second conducting layer 24, should be modified without damaging the common electrode 16C and the common line CL partially exposed by the fourth opening 264 and the fifth opening 265.

Figure 22:
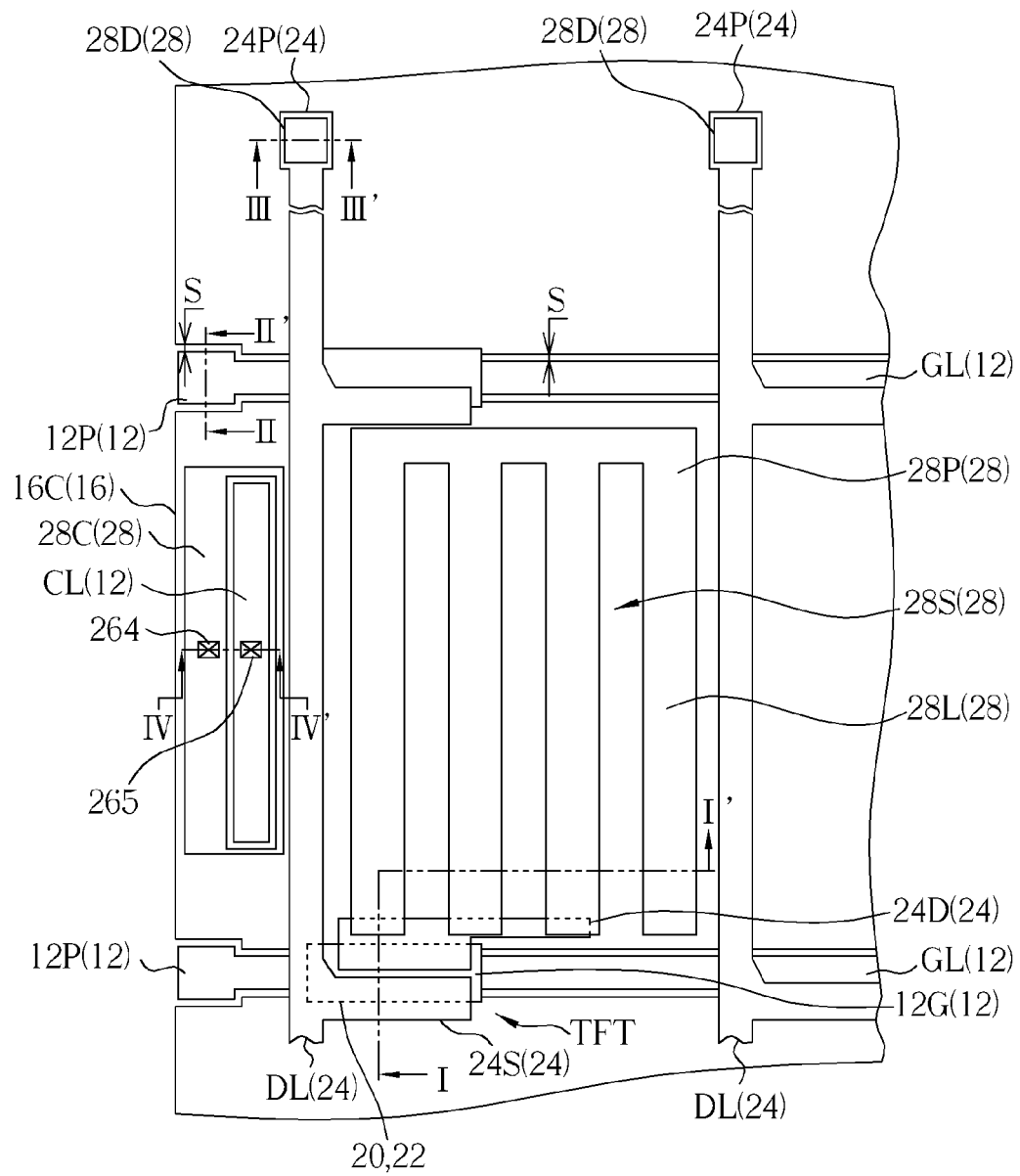
Figure 23:
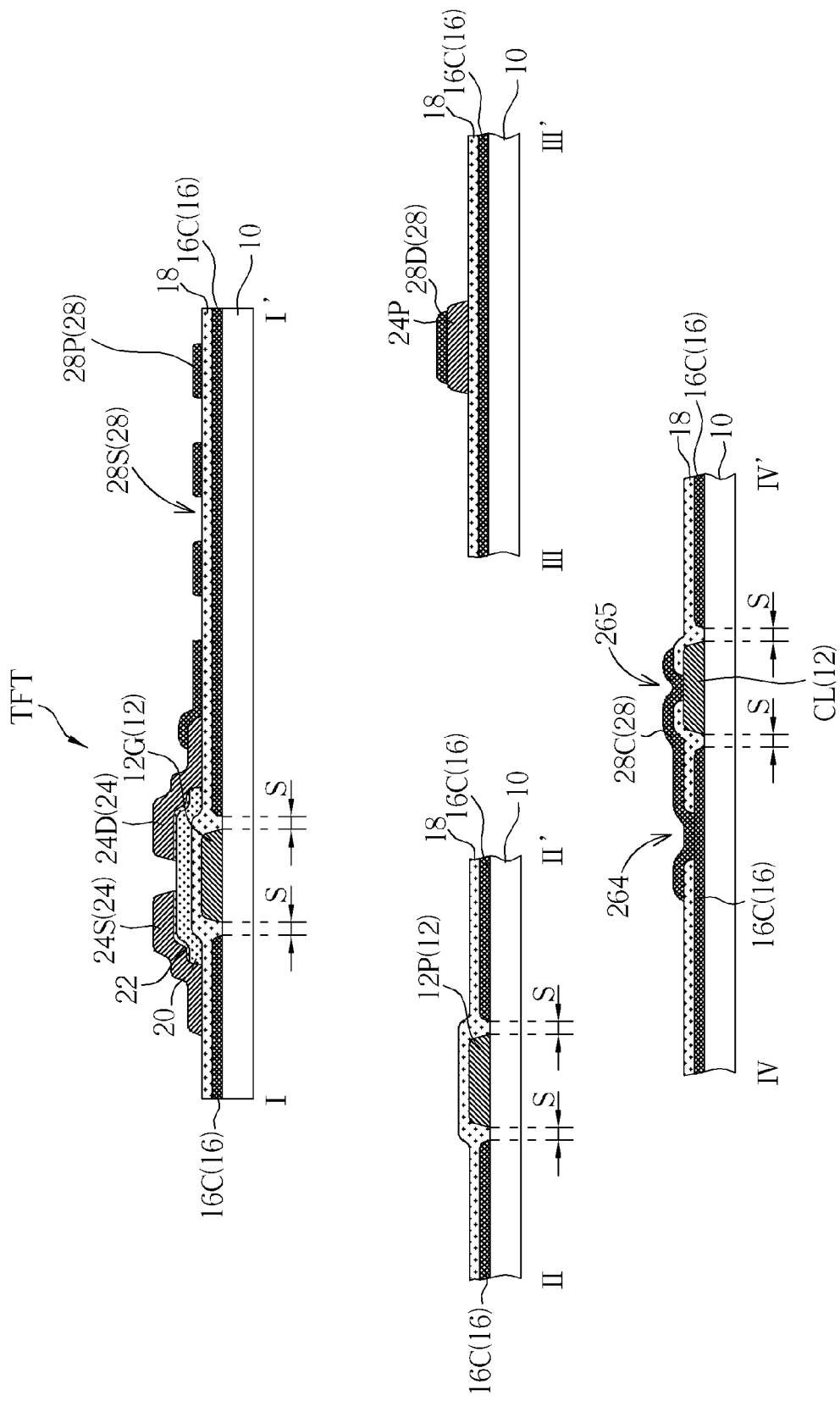

As shown in FIGS. 22 and 23, the pixel electrodes 28P, the data pad upper electrodes 28D, and a connection line 28C are formed by a fourth photolithographic process and made of the same conducting material. The connection line 28C is electrically connected to the common electrode 16C through the fourth opening 264 and electrically connected to the common line CL through the fifth opening 265. Except for forming the connection line 28C, the fourth photolithographic process of this embodiment is similar to the fourth photolithographic process of the first preferred embodiment detailed above and will not be redundantly described.

Figure 24:
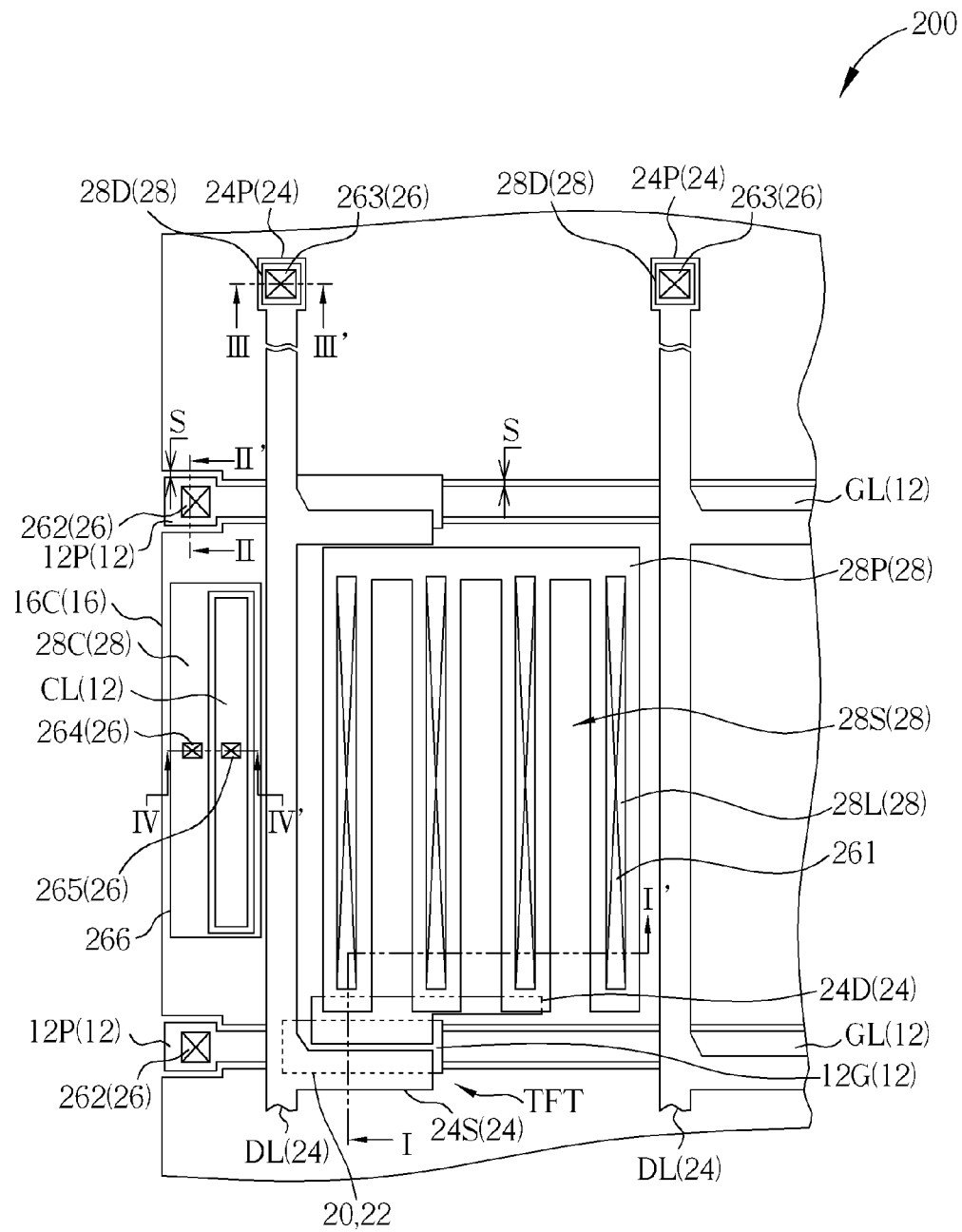
Figure 25:
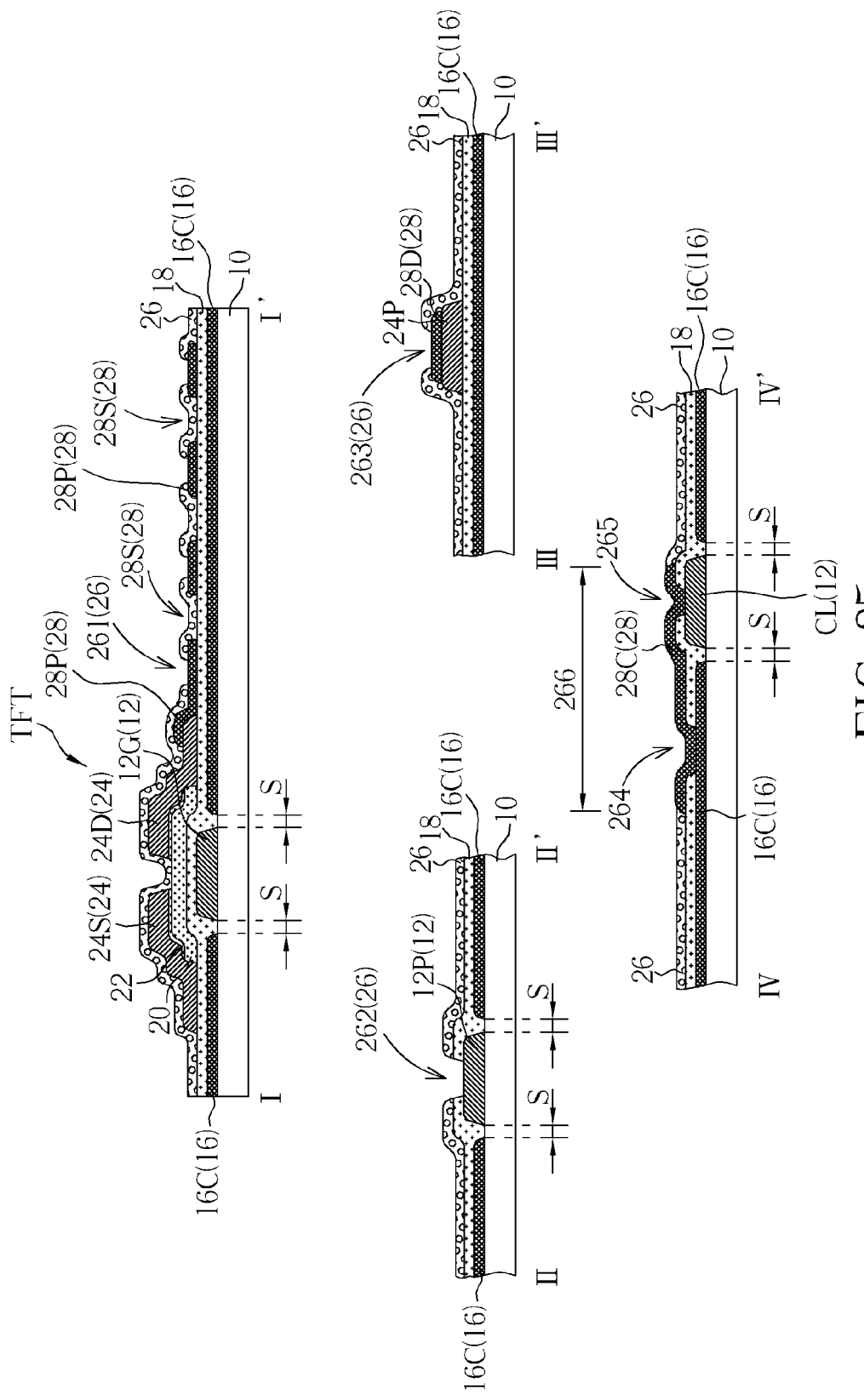

As shown in FIGS. 24 and 25, a passivation layer 26 is then formed on the gate insulating layer 18, the data lines DL, the source electrodes 24S, the drain electrodes 24D, the data pad upper electrodes 28D, the connection line 28C and the pixel electrode 28P. A fifth photolithographic process is then performed to pattern the passivation layer 26 to form a plurality of first openings 261, a plurality of second openings 262, a plurality of third openings 263, and a sixth opening 266. The sixth opening 266 at least partially exposes the connection line 28C, and a common signal line (not shown) may be electrically connected to the connection line 28C through the sixth opening 266. Therefore, common signals may be applied via the common signal line to the connection line 28C. Except for forming the sixth opening 266, the fifth photolithographic process of this embodiment is similar to the fifth photolithographic process of the first preferred embodiment detailed above and will not be redundantly described.

Please refer to FIGS. 24 and 25 again, along with FIGS. 12 and 13. FIGS. 24 and 25 illustrate an array substrate of an FFS mode LCD panel according to the second preferred embodiment of the present invention, where FIG. 25 is a cross-sectional diagram taken along cross-sectional lines I-I', II-II', III-III' and IV-IV' in FIG. 24. As shown in FIGS. 24, 25, 12, and 13, compared with the array substrate 100 mentioned above, an array substrate 200 of this embodiment further includes a common line CL and a connection line 28C. The common line CL is disposed on the substrate 10. The common line CL, the gate electrode 12G and the gate line CL are made of the same conducting material. The common line CL, the common electrode 16C, the gate electrode 12G, the gate line GL, and the gate pad electrode 12P are coplanar. Specifically, the common line CL, the common electrode 16C, the gate line GL, the gate electrode 12G, and the gate pad electrode 12P are disposed on the same layer. In addition, the gate insulating layer 18 further has a fifth opening 265 partially exposing the common line CL. The connection line 28C is electrically connected to the common electrode 16C through the fourth opening 264 and electrically connected to the common line CL through the fifth opening 265. Except the common line CL, the connection line 28C, and the fifth opening 265, the allocation and the properties of the components in the array substrate 200 are similar to the array substrate 100 of the first preferred embodiment and will not be redundantly described.

Figure 26:
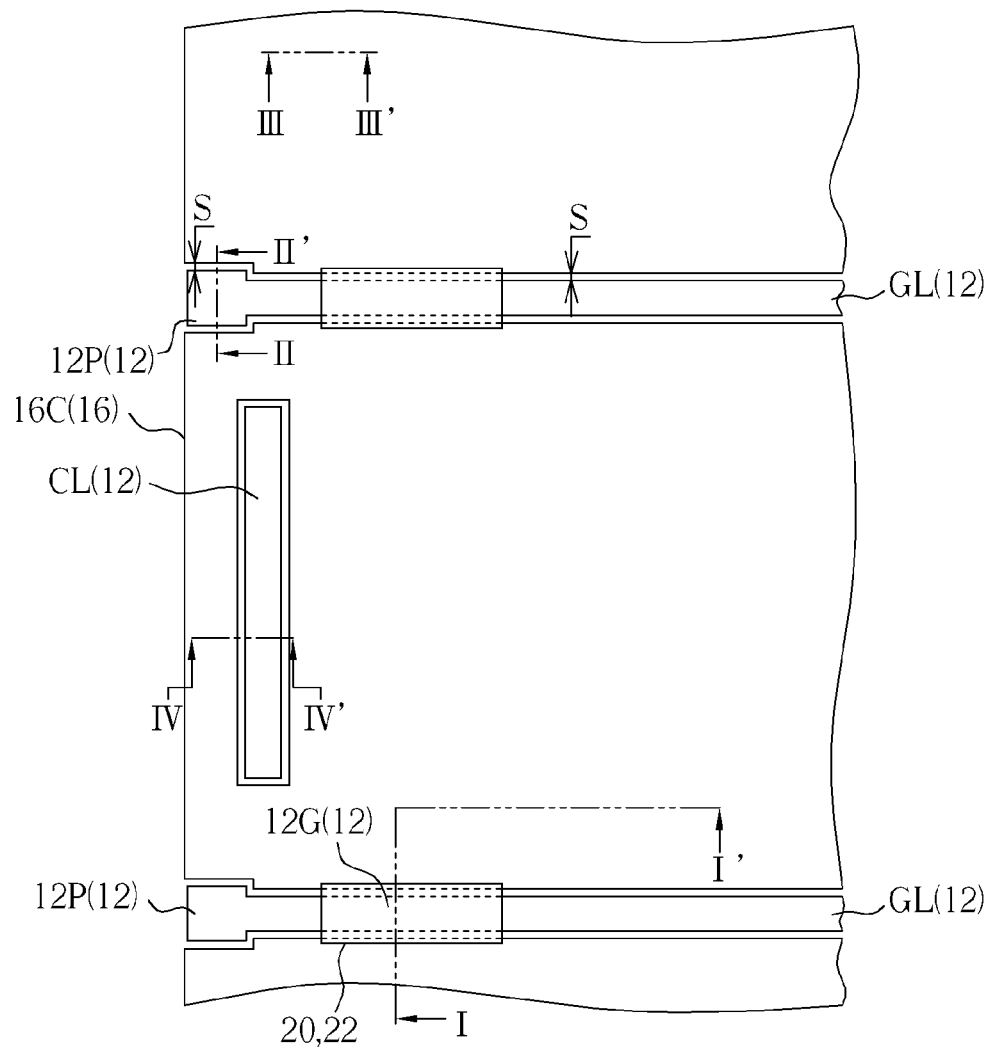
FIGS. 26-30 are schematic diagrams illustrating a method of forming an array substrate of an FFS mode LCD panel according to the third preferred embodiment of the present invention.
Figure 27:
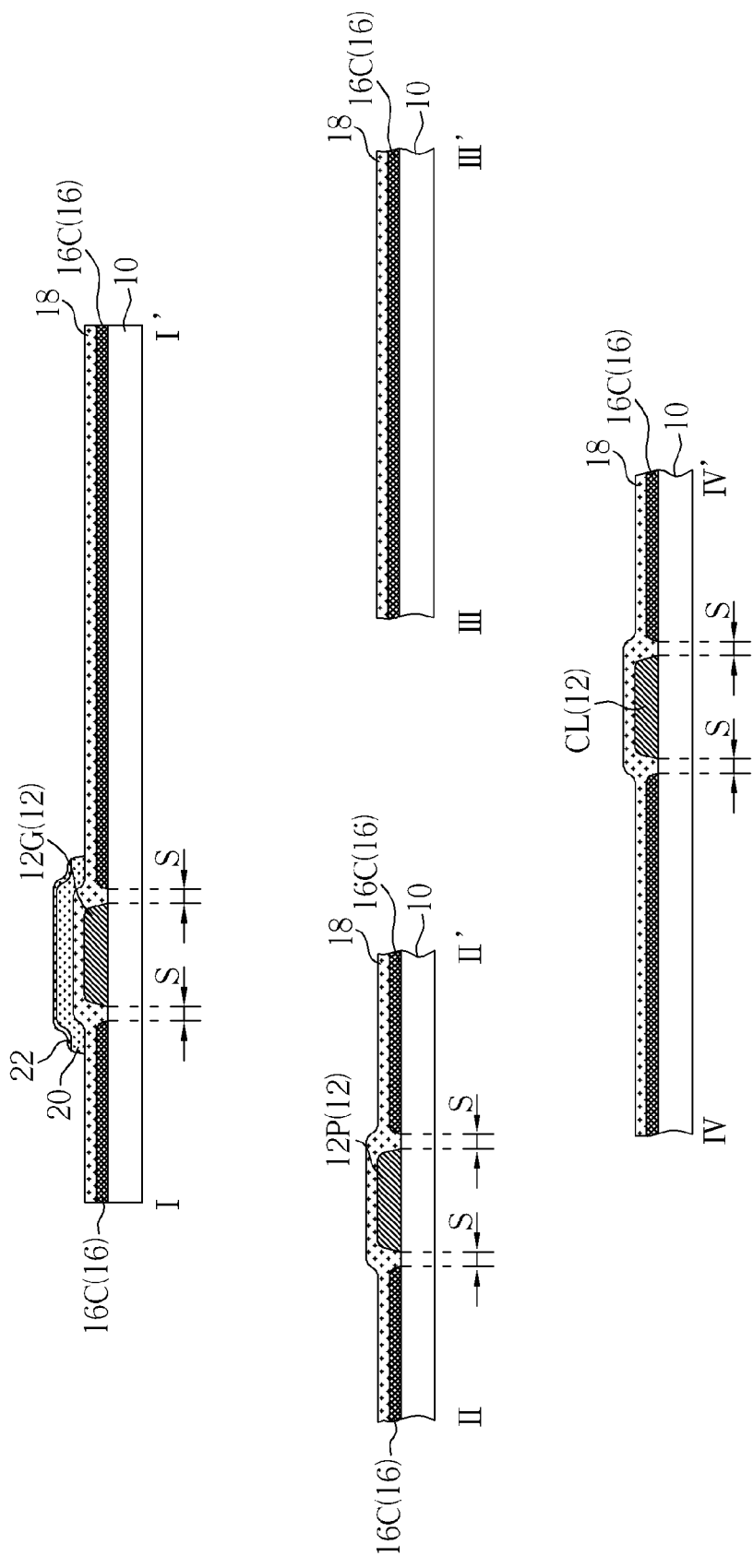
Figure 28:
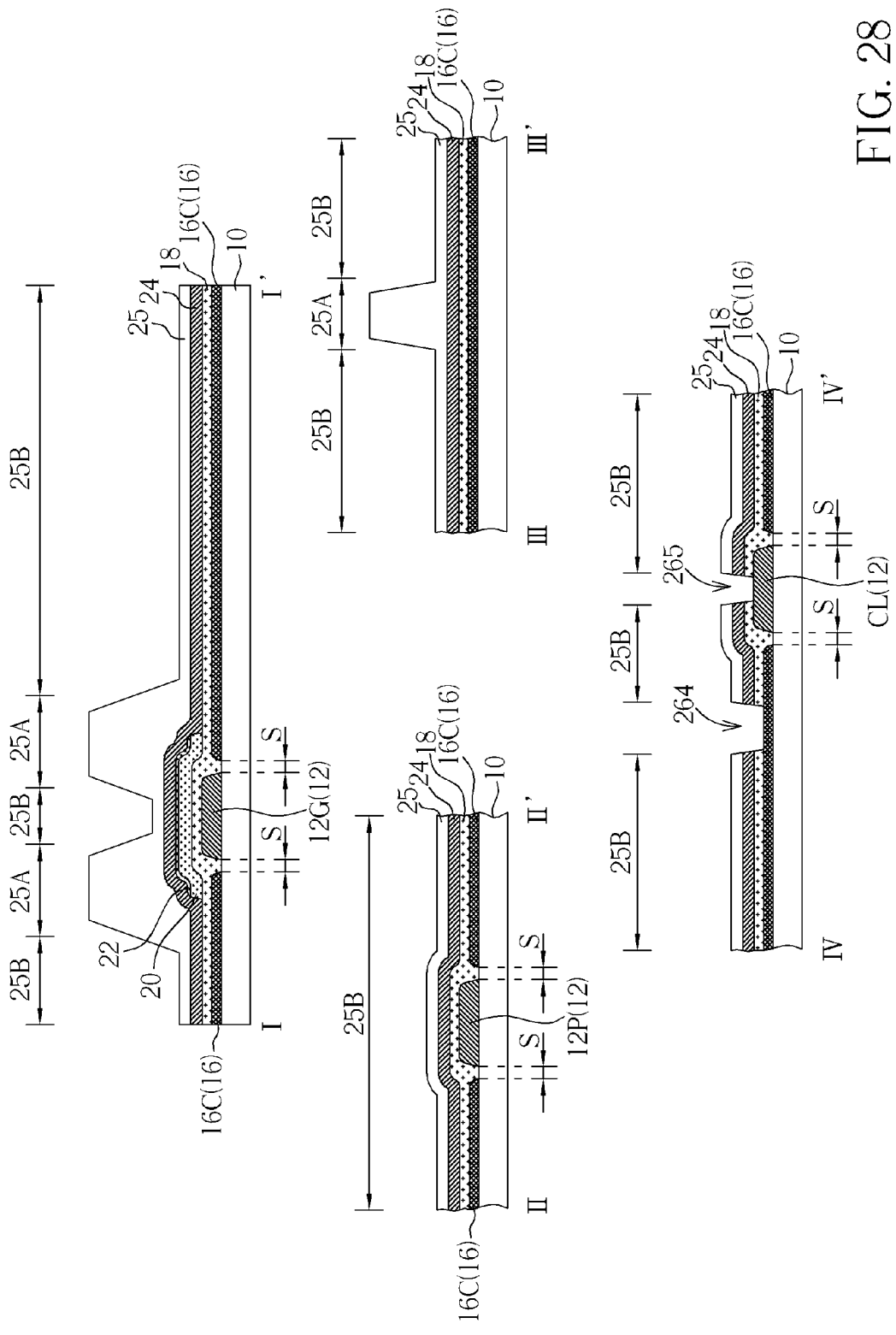
Figure 29:
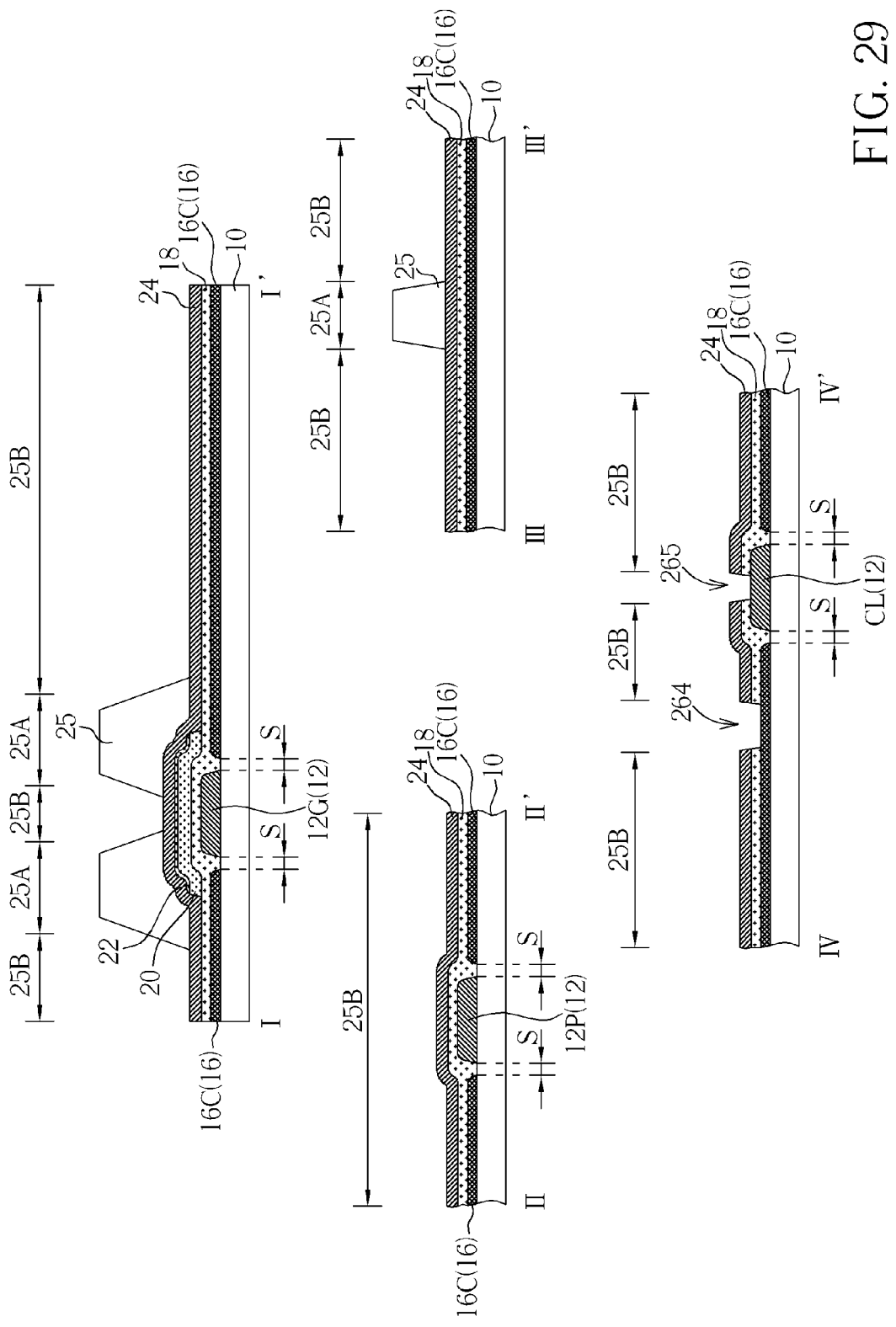
Figure 30:
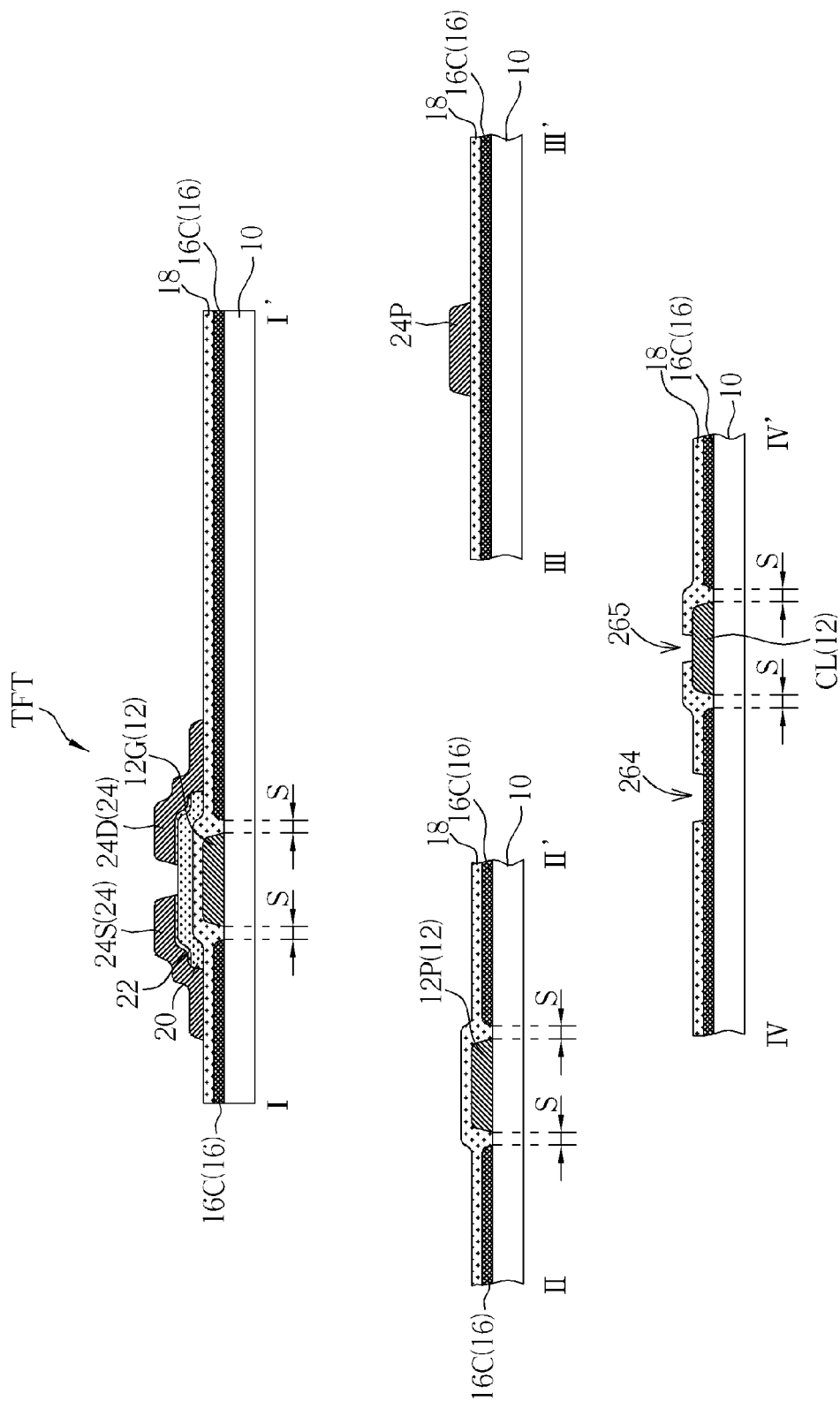

Please refer to FIGS. 26-30, as well as FIGS. 14-25. FIGS. 26-30 are schematic diagrams illustrating a method of forming an array substrate of an FFS mode LCD panel according to the third preferred embodiment of the present invention. FIG. 26 is a top-view diagram, and FIGS. 27-30 are cross-sectional view diagrams taken along cross-sectional lines I-I', II-II', III-III' and IV-IV'. FIGS. 26 and 27 are schematic diagrams illustrating a second photolithographic process of this embodiment, and FIGS. 28-30 are schematic diagrams illustrating a third photolithographic process of this embodiment. FIG. 20 is a top-view diagram of FIG. 30. A first photolithographic process, a fourth photolithographic process, and a fifth photolithographic process of this embodiment are similar to the first photolithographic process, the fourth photolithographic process, and the fifth photolithographic process of the second preferred embodiment detailed above and will not be redundantly described. As shown in FIGS. 26 and 27, in this embodiment, a patterned ohmic contact layer 22 and a patterned semiconductor layer 20 are formed by the second photolithographic process. The common line CL and the pixel electrode 16C are still completely covered by the gate insulating layer 18 after the second photolithographic process.

As shown in FIGS. 28-30 and FIG. 20, the third photolithographic process including the following steps is performed. Firstly, a second conducting layer 24 is formed on the gate insulating layer 18, the patterned ohmic contact layer 22, and the patterned semiconductor layer 20. A third patterned photoresist 25 is then formed on the second conducting layer 24 to block portions of the second conducting layer 24. It is worth noticing that, in this embodiment, the third patterned photoresist 25 includes a third thickness region 25A and a fourth thickness region 25B, and a thickness of the fourth thickness region 25B is smaller than a thickness of the third thickness region 25A. The thickness difference between the third thickness region 25A and the fourth thickness region 25B may be formed by an exposure process with a multi-tone photomask (not shown), wherein the multi-tone photomask includes at least three different regions with different transmittances to exposure energy, but the thickness difference between the third thickness region 25A and the fourth thickness region 25B of the third patterned photoresist 25 is not limited to this and may be formed by other appropriate methods. After forming the third patterned photoresist 25, at least a part of the second conducting layer 24 and at least a part of the gate insulating layer 18 unblocked by the third patterned photoresist 25 are removed, for instance by etching, to form a fourth opening 264 and a fifth opening 265. The fourth opening 264 partially exposes the common electrode 16C, and the fifth opening 265 partially exposes the common line CL. Subsequently, the third patterned photoresist 25 is thinned by a thinning process such as an ashing process, but the present invention is not limited to this. The thickness of the fourth thickness region 25B is still smaller than the thickness of the third thickness region 25A after the ashing process. In this embodiment, the photoresist within the fourth thickness region 25B is totally removed by the ashing process, and a part of the second conducting layer 24 is still covered by the third patterned photoresist 25 within the third thickness region 25A. After the ashing process, the second conducting layer 24 unblocked by the third patterned photoresist 25 is removed, for instance by etching, to form a plurality of data lines DL, a plurality of source electrodes 24S, a plurality of drain electrodes 24D, and a plurality of data pad lower electrodes 24P on the gate insulating layer 18. It is worth noticing that in another preferred embodiment of the present invention, the gate insulating layer 18 unblocked by the third patterned photoresist 25 may be undamaged before and after the ashing process, and at least a part of part of the gate insulating layer 18 outside of the third thickness region 25A and the fourth thickness region 25B may be removed when forming the source electrodes 24S and the drain electrodes 24D. Finally, the third patterned photoresist 25 is removed by a stripping process. It is appreciated that in the third photolithographic process, the patterned ohmic contact layer 22 is patterned again so that the patterned ohmic contact layer 22 is disposed corresponding to the source electrodes 24S and the drain electrodes 24D, i.e. the patterned ohmic contact layer 22 is located between the patterned semiconductor layer 20 and the source electrodes 24S, and between the patterned semiconductor layer 20 and the drain electrodes 24D for forming the ohmic contact between the patterned semiconductor layer 20 and the source electrodes 24S or drain electrodes 24D.

Figure 31:
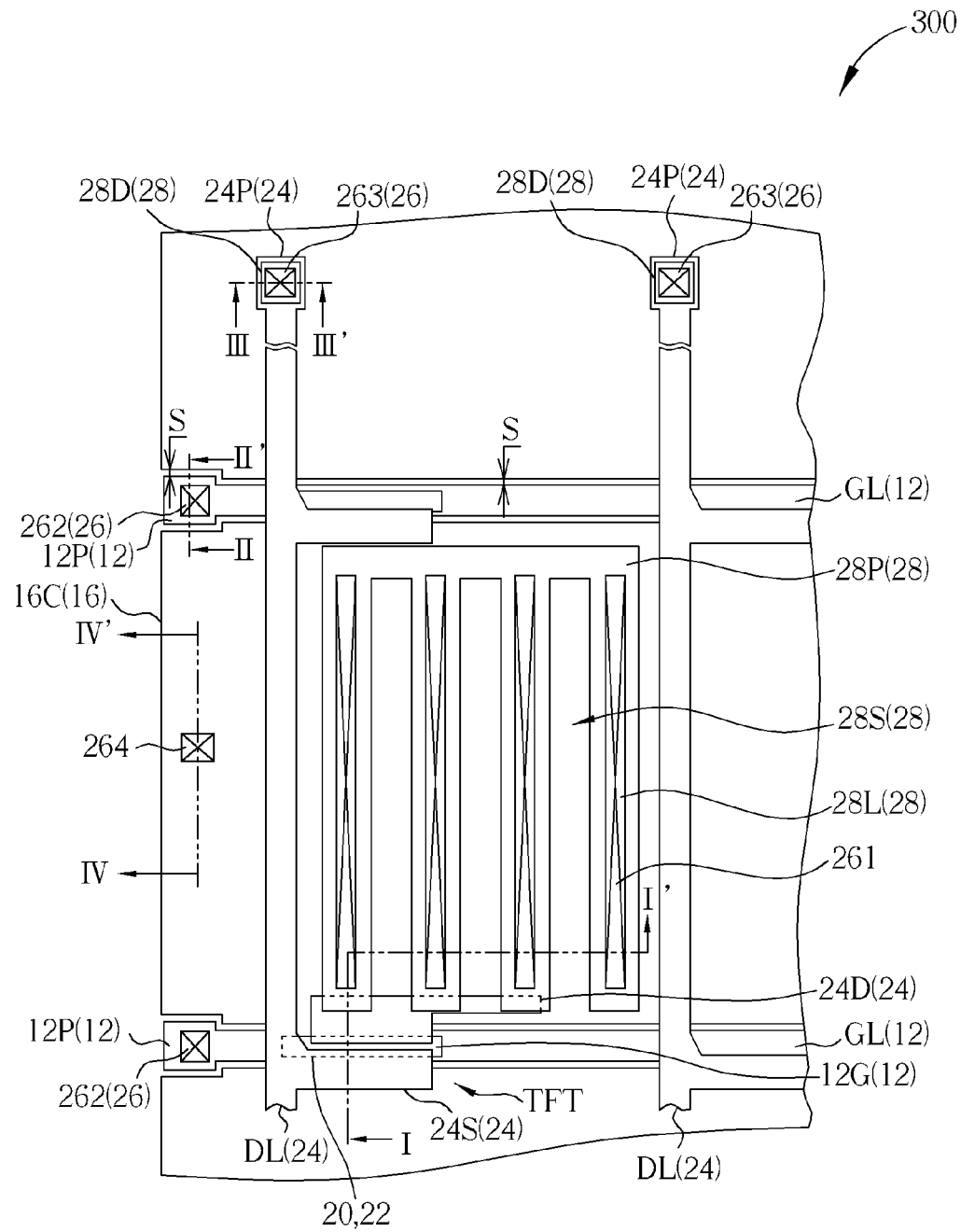
FIGS. 31-32 are schematic diagrams illustrating an array substrate of an FFS mode LCD panel according to the fourth preferred embodiment of the present invention.
Figure 32:
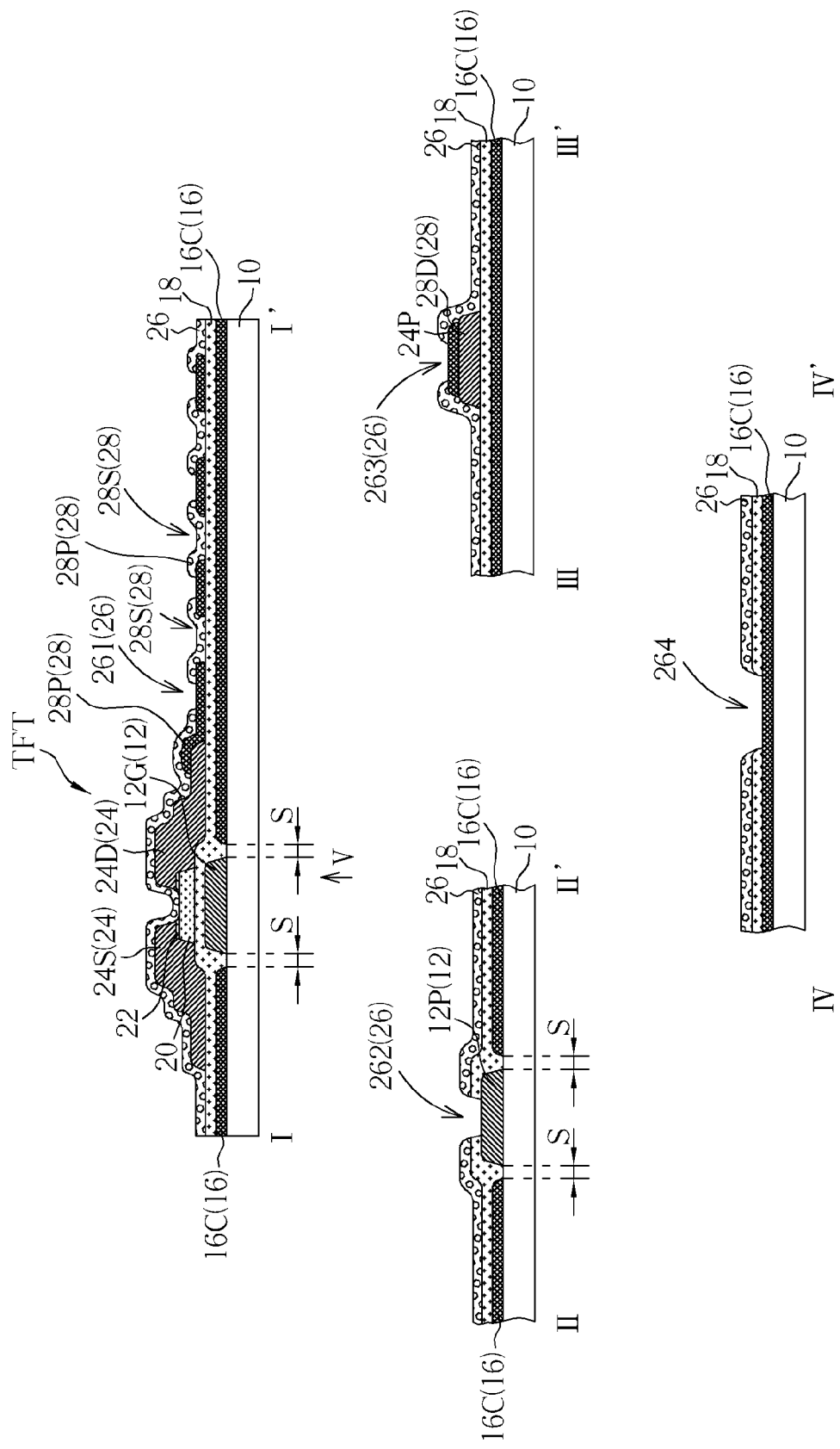

Please refer to FIGS. 31 and 32, and FIGS. 12 and 13 as well. FIGS. 31 and 32 are schematic diagrams illustrating an array substrate of an FFS mode LCD panel according to the fourth preferred embodiment of the present invention, where FIG. 32 is a cross-sectional diagram taken along cross-sectional lines I-I', II-II', III-III' and IV-IV' in FIG. 31. As shown in FIGS. 31 and 32, in an array substrate 300 of this embodiment, the gate electrode 12G completely covers the patterned semiconductor layer 20 in a vertical projective direction V. Except the relative relationship between the gate electrode 12G and the patterned semiconductor layer 20, the allocation and the properties of the components in the array substrate 300 are similar to the array substrate 100 of the first preferred embodiment and will not be redundantly described. It is worth noticing that the stability of the thin film transistor TFT in this embodiment may be improved, because the gate electrode 12G may be employed as a light shielding device for effectively preventing light from influencing the electrical properties of the patterned semiconductor layer 20, especially when light comes from the vertical projective direction V.

In conclusion, the present invention forms the gate line, the gate electrode, and the common electrode by the same photolithographic process for reducing manufacturing steps. The aperture ratio of the array substrate of the FFS mode LCD panel may be improved because the pixel electrode is in contact with the drain electrode without utilizing any contact holes. Additionally, the pixel electrode is covered by the passivation layer and partially exposed by the opening of the passivation layer. Therefore, the performance of driving liquid crystal molecules in the FFS mode LCD panel may be enhanced, because interference materials between the pixel electrode and the common electrode are reduced.

Those skilled in the art will readily observe that numerous modifications and alterations of the device and method may be made while retaining the teachings of the invention.

What is claimed is:

1. A method of forming an array substrate of a fringe field switching (FFS) mode liquid crystal display (LCD) panel, comprising:
providing a substrate;
forming a plurality of gate lines, a plurality of gate electrodes and a common electrode on the substrate by a first photolithographic process, the first photolithographic process comprising:
forming a first conducting layer on the substrate, and forming a first patterned photoresist on the first conducting layer;
removing the first conducting layer unblocked by the first patterned photoresist to form the gate lines and the gate electrodes on the substrate;
forming a first transparent conducting layer covering the substrate and the first patterned photoresist; and
stripping the first patterned photoresist as well as the first transparent conducting layer which covers the first patterned photoresist to form the common electrode on the substrate;
forming a gate insulating layer which covers the substrate, the gate lines, the gate electrodes and the common electrode;
forming a patterned semiconductor layer on the gate insulating layer by a second photolithographic process;
forming a plurality of data lines, a plurality of source electrodes and a plurality of drain electrodes on the gate insulating layer and the patterned semiconductor layer by a third photolithographic process;
forming a plurality of pixel electrodes on the gate insulating layer by a fourth photolithographic process, wherein each of the pixel electrodes is in contact with a corresponding drain electrode for being electrically connected to the corresponding drain electrode; and
forming a passivation layer on the gate insulating layer, the data lines, the source electrodes the drain electrodes, and the pixel electrodes by a fifth photolithographic process, wherein the passivation layer has a plurality of first openings, and each of the first openings at least partially exposes the pixel electrode.

2. The method of forming the array substrate of the FFS mode LCD panel of claim 1, wherein the first conducting layer is etched in the first photolithographic process so that a width of each of the gate lines is smaller than a width of the first patterned photoresist disposed thereon, and a width of each of the gate electrodes is smaller than a width of the first patterned photoresist disposed thereon.

3. The method of forming the array substrate of the FFS mode LCD panel of claim 1, wherein each of the pixel electrodes has a plurality of stripe electrodes arranged in parallel and electrically connected together, and a plurality of slits arranged between the stripe electrodes.

4. The method of forming the array substrate of the FFS mode LCD panel of claim 1, wherein each of the gate lines comprises a gate pad electrode, each of the data lines comprises a data pad lower electrode.

5. The method of forming the array substrate of the FFS mode LCD panel of claim 4, further comprising forming a plurality of data pad upper electrodes by the fourth photolithographic process, wherein each of the data pad upper electrodes is electrically connected to the corresponding data pad lower electrode.

6. The method of forming the array substrate of the FFS mode LCD panel of claim 5, wherein the passivation layer and the gate insulating layer have a plurality of second openings, the passivation layer has a plurality of third openings, the gate insulating layer has at least one fourth opening, each of the second openings partially exposes the corresponding gate pad electrode, each of the third openings partially exposes the corresponding data pad upper electrode, and the fourth opening partially exposes the common electrode.

7. The method of forming the array substrate of the FFS mode LCD panel of claim 6, further comprising forming a common line by the first photolithographic process.

8. The method of forming the array substrate of the FFS mode LCD panel of claim 7, wherein the gate insulating layer further has at least one fifth opening, and the fifth opening partially exposes the common line.

9. The method of forming the array substrate of the FFS mode LCD panel of claim 8, further comprising forming a connection line by the fourth photolithographic process, wherein the connection line is electrically connected to the common electrode through the fourth opening and electrically connected to the common line through the fifth opening.

10. The method of forming the array substrate of the FFS mode LCD panel of claim 8, wherein the second photolithographic process comprises:
forming a semiconductor layer on the gate insulating layer, and forming a second patterned photoresist on the semiconductor layer, wherein the second patterned photoresist comprises a first thickness region and a second thickness region, and a thickness of the second thickness region is smaller than a thickness of the first thickness region;

removing at least a part of the semiconductor layer unblocked by the second patterned photoresist;

thinning the second patterned photoresist subsequent to removing a part of the semiconductor layer, wherein the thickness of the second thickness region is still smaller than the thickness of the first thickness region after thinning;

removing at least a part of the semiconductor layer and at least a part of the gate insulating layer unblocked by the second patterned photoresist subsequent to thinning the second patterned photoresist to form the fourth opening, the fifth opening, and the patterned semiconductor layer, and stripping the second patterned photoresist.

11. The method of forming the array substrate of the FFS mode LCD panel of claim 8, wherein the third photolithographic process comprises:

forming a second conducting layer on the gate insulating layer and the patterned semiconductor layer, and forming a third patterned photoresist on the semiconductor layer, wherein the third patterned photoresist comprises a third thickness region and a fourth thickness region, and a thickness of the fourth thickness region is smaller than a thickness of the third thickness region;

removing at least a part of the second conducting layer and at least a part of the gate insulating layer unblocked by the third patterned photoresist to form the fourth opening and the fifth opening;

thinning the third patterned photoresist subsequent to removing a part of the second conducting layer and a part of the gate insulating layer, wherein the thickness of the fourth thickness region is still smaller than the thickness of the third thickness region after thinning;

removing the second conducting layer unblocked by the third patterned photoresist subsequent to thinning the third patterned photoresist to form the data lines, the source electrodes and the drain electrodes, and stripping the third patterned photoresist.

12. The method of forming the array substrate of the FFS mode LCD panel of claim 1, wherein a gap substantially ranging from 0.2 micrometers to 2 micrometers exists between the gate line and the common electrode, and a gap substantially ranging from 0.2 micrometers to 2 micrometers exists between the gate electrodes and the common electrode.

13. An array substrate of a fringe field switching (FFS) mode liquid crystal display (LCD) panel, comprising:

a substrate;

a gate line disposed on the substrate;

a data line disposed on the substrate;

a thin film transistor disposed on the substrate, wherein the thin film transistor comprises:

a gate electrode electrically connected to the gate line;

a gate insulating layer disposed on the gate electrode;

a patterned semiconductor layer disposed on the gate insulating layer; and a source electrode and a drain electrode disposed on the patterned semiconductor layer, wherein the source electrode is electrically connected to the data line;

a common electrode disposed between the substrate and the gate insulating layer, wherein the common electrode, the gate electrode and the gate line are coplanar;

a pixel electrode disposed on the gate insulating layer, wherein the pixel electrode is electrically connected to the drain electrode; and a passivation layer disposed on the pixel electrode, wherein the passivation layer has a first opening at least partially exposing the pixel electrode.

14. The array substrate of the FFS mode LCD panel of claim 13, wherein the gate electrode completely covers the patterned semiconductor layer in a vertical projective direction.

15. The array substrate of the FFS mode LCD panel of claim 13, wherein the pixel electrode has a plurality of stripe electrodes arranged in parallel and electrically connected together, and a plurality of slits arranged between the stripe electrodes.

16. The array substrate of the FFS mode LCD panel of claim 13, further comprising a gate pad electrode electrically connected to the gate line, a data pad lower electrode electrically connected to the data line, and a data pad upper electrode electrically connected to the data pad lower electrode, wherein the passivation layer and the gate insulating layer have a second opening exposing the gate pad electrode, the passivation layer has a third opening exposing the data pad upper electrode, and the insulating layer has a fourth opening exposing the common electrode.

17. The array substrate of the FFS mode LCD panel of claim 16, wherein the data pad upper electrode and the pixel electrode are made of the same transparent conducting material.

18. The array substrate of the FFS mode LCD panel of claim 13, further comprising a common line disposed on the substrate.

19. The array substrate of the FFS mode LCD panel of claim 18, wherein the gate insulating layer further has a fifth opening partially exposing the common line.

20. The array substrate of the FFS mode LCD panel of claim 19, further comprising a connection line electrically connected to the common electrode through the fourth opening and electrically connected to the common line through the fifth opening.

21. The array substrate of the FFS mode LCD panel of claim 18, wherein the common line, the gate electrode and the gate line are made of the same conducting material.

22. The array substrate of the FFS mode LCD panel of claim 13, wherein a gap substantially ranging from 0.2 micrometers to 2 micrometers exists between the gate line and the common electrode, and a gap substantially ranging from 0.2 micrometers to 2 micrometers exists between the gate electrode and the common electrode.

* * * * *